United States Patent
Yoon et al.

(10) Patent No.: US 11,557,560 B2
(45) Date of Patent: Jan. 17, 2023

(54) SEMICONDUCTOR PACKAGE FOR IMPROVING RELIABILITY

(71) Applicant: Samsung Electronics Co., Ltd., Suwon-si (KR)

(72) Inventors: Yeohoon Yoon, Yongin-si (KR); Hyungsun Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 109 days.

(21) Appl. No.: 17/223,601

(22) Filed: Apr. 6, 2021

(65) Prior Publication Data

US 2022/0059492 A1 Feb. 24, 2022

(30) Foreign Application Priority Data

Aug. 24, 2020 (KR) ........................ 10-2020-0106427

(51) Int. Cl.
*H01L 23/00* (2006.01)
*H01L 23/498* (2006.01)

(52) U.S. Cl.
CPC ........ *H01L 24/20* (2013.01); *H01L 23/49816* (2013.01); *H01L 24/06* (2013.01); *H01L 24/16* (2013.01); *H01L 24/24* (2013.01); *H01L 2224/0401* (2013.01); *H01L 2224/06102* (2013.01); *H01L 2224/06181* (2013.01); (Continued)

(58) Field of Classification Search
CPC ... H01L 24/20; H01L 23/49816; H01L 24/06; H01L 24/16; H01L 24/24; H01L 2224/0401; H01L 2224/06102; H01L 2224/06181; H01L 2224/16227; H01L 2224/16238; H01L 2224/2101; H01L 2224/2105; H01L 2224/211; H01L 2224/214; H01L 2224/24245; H01L 2224/24997; H01L 2924/3512; H01L 24/02; H01L 25/0655; H01L 23/3114; H01L 23/525; H01L 23/3128; H01L 24/13; H01L 2224/02331; H01L 2224/02333; H01L 2224/02373; H01L 2224/02381;
(Continued)

(56) References Cited

U.S. PATENT DOCUMENTS 6,465,886 B1 * 10/2002 Horiuchi ................. H01L 24/02
257/784
7,973,418 B2 7/2011 Alvarado et al.
(Continued)

FOREIGN PATENT DOCUMENTS

KR 10-2015-0034967 A 4/2015

*Primary Examiner* — Douglas W Owens
(74) *Attorney, Agent, or Firm* — Muir Patent Law, PLLC

(57) ABSTRACT

A semiconductor package includes a chip level unit including a semiconductor chip; a medium level unit; and a solder ball unit. The solder ball unit is to be connected to a circuit substrate. The medium level unit includes: a wiring pad layer on a first protection layer; a second protection layer including a pad-exposing hole on the first protection layer, a post layer in the pad-exposing hole on the wiring pad layer; and a third protection layer including a post-exposing hole on the second protection layer. A width or diameter of the post-exposing hole is smaller than a width or diameter of the pad-exposing hole; and a barrier layer is disposed in the post-exposing hole on the post layer. The solder ball unit includes a solder ball on the barrier layer.

20 Claims, 24 Drawing Sheets

(52) U.S. Cl.
CPC ............. *H01L 2224/16227* (2013.01); *H01L 2224/16238* (2013.01); *H01L 2224/211* (2013.01); *H01L 2224/2101* (2013.01); *H01L 2224/214* (2013.01); *H01L 2224/2105* (2013.01); *H01L 2224/24245* (2013.01); *H01L 2224/24997* (2013.01); *H01L 2924/3512* (2013.01)

(58) Field of Classification Search
CPC ......... H01L 2224/13008; H01L 23/481; H01L 23/492
See application file for complete search history.

(56) References Cited

U.S. PATENT DOCUMENTS

| | | | |
|---|---|---|---|
| 3,063,495 A1 | 11/2011 | Miyata et al. | |
| 9,035,468 B2 | 5/2015 | Shih et al. | |
| 9,431,215 B2 | 8/2016 | Wang | |
| 9,917,043 B2 * | 3/2018 | Chang Chien | H01L 23/49894 |
| 10,553,526 B2 | 2/2020 | Hsu et al. | |
| 2003/0052415 A1 * | 3/2003 | Boettcher | H01L 24/03 257/784 |
| 2014/0124928 A1 * | 5/2014 | Lin | H01L 24/11 257/738 |
| 2016/0379915 A1 | 12/2016 | Lee et al. | |
| 2020/0091066 A1 | 3/2020 | Kim et al. | |
| 2022/0285257 A1 * | 9/2022 | Hsu | H05K 1/116 |
| 2022/0285304 A1 * | 9/2022 | Choi | H01L 24/81 |

* cited by examiner

SEMICONDUCTOR PACKAGE FOR IMPROVING RELIABILITY

CROSS-REFERENCE TO RELATED APPLICATION

This application claims priority under 35 U.S.C. § 119 to Korean Patent Application No. 10-2020-0106427, filed on Aug. 24, 2020, in the Korean Intellectual Property Office, the disclosure of which is incorporated by reference herein in its entirety.

BACKGROUND

The inventive concept relates to a semiconductor package, and more particularly, to a semiconductor package for improving the reliability thereof.

The semiconductor package may include solder balls for electrically connecting a semiconductor chip to a circuit substrate. When the semiconductor chip is physically and electrically connected to the circuit substrate by using the solder balls, cracks, for example, in a redistribution layer of the circuit substrate, may form. Therefore, it would be beneficial to increase the reliability of the semiconductor package by reducing stress applied to the semiconductor chip.

SUMMARY

Aspects of the inventive concept provides a semiconductor package capable of increasing the reliability thereof by reducing stress applied to a semiconductor chip.

The semiconductor package according to an embodiment of the inventive concept includes: a chip level portion comprising a semiconductor chip, a medium level portion on the semiconductor chip level portion, and a solder ball portion on the medium level portion, wherein the solder ball portion is configured to be connected to a circuit substrate. The medium level portion includes a wiring pad layer on a first protection layer, the first protection layer being a layer of a plurality of protection layers and being directly adjacent to the chip level portion; a second protection layer comprising a pad-exposing hole exposing the wiring pad layer on the first protection layer, the second protection layer being an intermediate portion of the plurality of protection layers; a post layer in the pad-exposing hole on the wiring pad layer; a third protection layer on the second protection layer and comprising a post-exposing hole on the second protection layer and exposing the post layer, the third protection layer corresponding to an outer protection layer of the plurality of protection layers, wherein a width or diameter of the post-exposing hole is less than a width or diameter of the pad-exposing hole; and a barrier layer in the post-exposing hole on the post layer. The solder ball portion comprises a solder ball on the barrier layer According to an aspect of the inventive concept, a semiconductor package includes: a semiconductor chip; a first protection layer on the semiconductor chip; a redistribution pad layer on the first protection layer; a second protection layer including a pad-exposing hole exposing the redistribution pad layer on the redistribution pad layer; a post layer in the pad-exposing hole on the redistribution pad layer; a third protection layer including a post-exposing hole on the post layer and exposing the post layer, wherein the post-exposing hole is smaller than the pad-exposing hole; a barrier layer in the pad-exposing hole on the post layer; and a solder layer on the barrier layer. A modulus of elasticity of the second protection layer may be greater than a modulus of elasticity of the third protection layer.

According to another aspect of the inventive concept, a semiconductor package includes: a redistribution structure comprising a redistribution layer including a first portion penetrating the first protection layer and connected to the chip pad, the first portion extending from the chip pad on the first protection layer in a horizontal direction, and a second portion at one end portion of the redistribution layer; a second protection layer comprising a pad-exposing hole on the redistribution structure and exposing the second portion of the redistribution layer; a post layer in the pad-exposing hole on the redistribution structure; a third protection layer comprising a post-exposing hole on the post layer and exposing the post layer, wherein the post-exposing hole is smaller than the pad-exposing hole; a barrier layer in the post-exposing hole on the post layer; and a solder layer on the barrier layer. A maximum width or diameter of the post layer is equal to or less than a minimum width or diameter of the barrier layer, and a modulus of elasticity of the second protection layer is greater than a modulus of elasticity of the third protection layer.

A width (or diameter) of the post layer may be equal to or less than a width (or diameter) of the barrier layer, and a modulus of elasticity of the second protection layer may be greater than a modulus of elasticity of the third protection layer.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Below, the inventive concept will now be described more fully with reference to the accompanying drawings, in which example embodiments are shown. The inventive concept may be implemented by any one of the various embodiments, or by combining one or more of various embodiments. Therefore, the technical idea of the inventive concept is not limited to only one embodiment.

In the present specification, the description of components in singular form may include plural components having the structure of the singly-described component, unless the context clearly indicates otherwise. In the present specification, the drawings may be exaggerated for clarifying the various aspects of the inventive concept.

Figure 1:
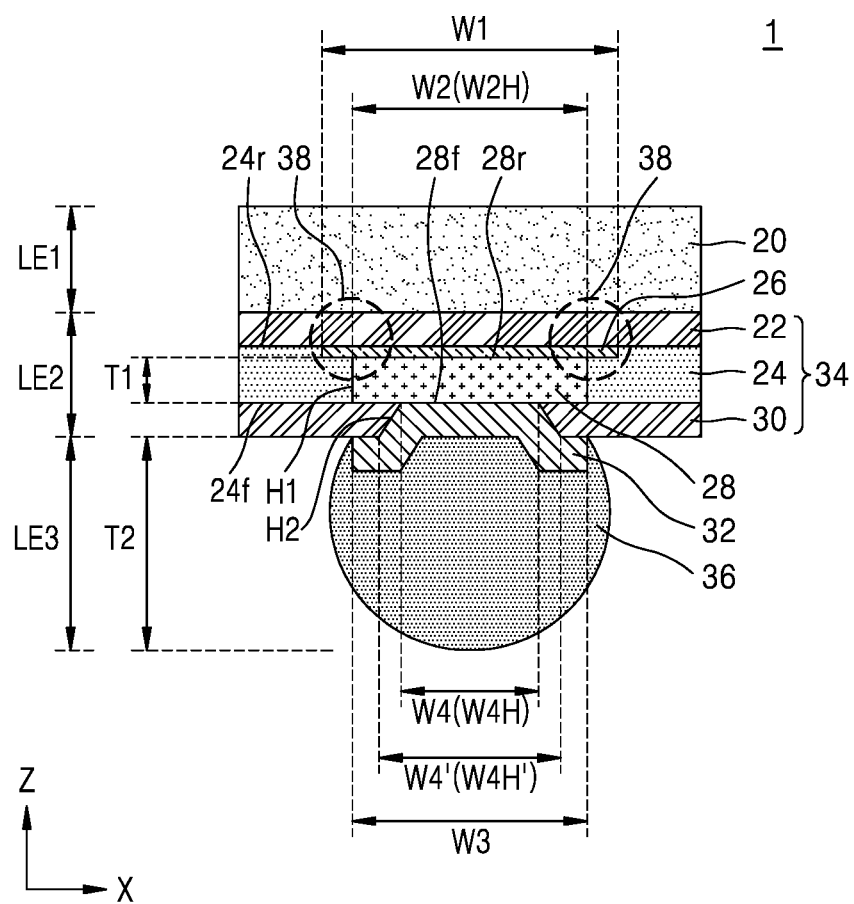
FIG. 1 is a cross-sectional view of a semiconductor package according to an embodiment of the inventive concept.
Figure 2:
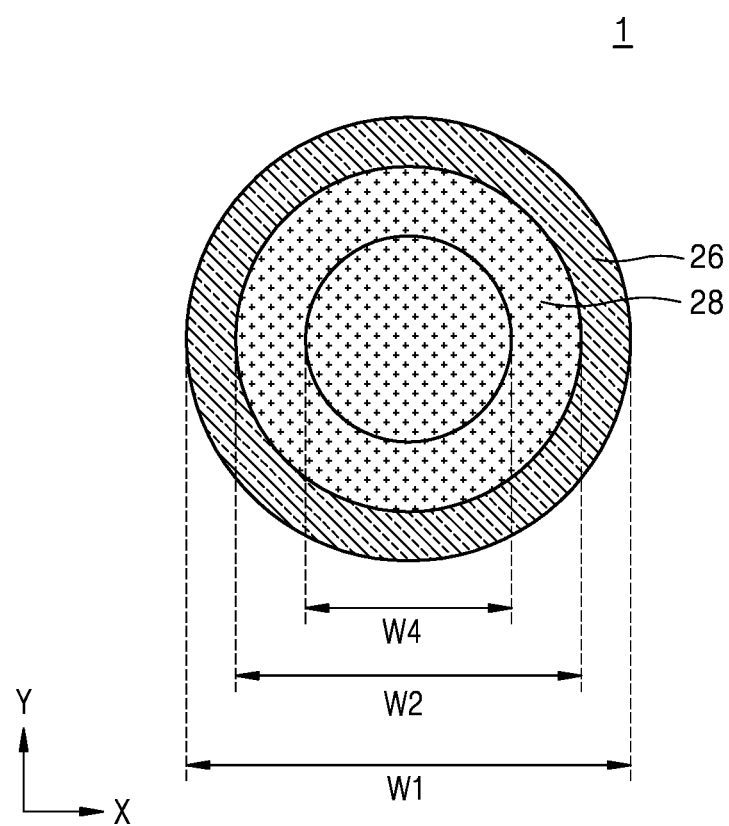
FIG. 2 is a plan layout diagram of a wiring pad layer and a post layer in FIG. 1, according to an example embodiment.

FIG. 1 is a cross-sectional view of a semiconductor package according to an embodiment of the inventive concept, and FIG. 2 is a plan layout diagram of a wiring pad layer and a post layer in FIG. 1.

In FIGS. 1 and 2, an X-axis direction and a Y-axis direction may be directions parallel to a surface of a semiconductor chip 20 (or a semiconductor substrate), and a Z-axis direction may be a direction perpendicular to the surface of the semiconductor chip 20 (or the semiconductor substrate).

A semiconductor package 1, only a portion of which is shown, may include a wafer level package. The semiconductor package 1 may include a chip level unit LE1, a medium level unit LE2, and a solder ball unit LE3 in a cross-sectional view (e.g., in a cross-sectional view in a Z-axis direction). Hereinafter, for convenience, a downward direction of the chip level unit LE1, (e.g., the Z axis direction), is referred to as an vertical direction. The chip level unit LE1 may be referred to as a chip level portion, chip portion, or simply semiconductor chip. The medium level unit LE2 may be referred to as a medium-level portion, or medium-level structure, or intermediate structure. The solder ball unit LE3 may be referred to as a solder ball portion, or a solder ball structure, or an external connection terminal portion. The different portions may also be referred to as top, middle, and bottom portions (with the chip on the top and the solder balls on the bottom, for reference). Spatially relative terms, such as "beneath," "below," "lower," "above," "upper" and the like, may be used herein for ease of description to describe positional relationships, such as illustrated in the figures. It will be understood that the spatially relative terms encompass different orientations of the device in addition to the orientation depicted in the figures.

The chip level unit LE1 may include the semiconductor chip 20. The semiconductor chip 20 may include a semiconductor layer, for example, a silicon layer. The medium level unit LE2 may be on the chip level unit LE1 (e.g., below the chip level unit LE1). The medium level unit LE2 may include a wiring pad layer 26, a post layer 28, a barrier layer 32, and a plurality of protection layers 34. The barrier layer 32 may also be referred to as an under barrier metal layer. The barrier layer 32 may also be referred to as a solder pad. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The solder ball unit LE3 may be on the medium level unit LE2 (e.g., below the medium level unit LE2). The solder ball unit LE3 may include a solder ball 36 to be physically or electrically connected to a circuit substrate (or a board substrate). The solder ball 36 may include or be formed of a low-strength solder composition including, for example, Sn as a base metal and Ag and Cu as supplementary metals. The solder ball 36 may alternatively include or be formed of a high-strength solder composition including, for example, Sn as a base metal and Ag, Cu, and Bi as supplementary metals.

A structure of the semiconductor package 1 of the inventive concept is described in detail based on the medium level unit LE2. The medium level unit LE2 may include a plurality of protection layers 34 on the chip level unit LE1. The wiring pad layer 26 may be disposed on a first protection layer 22 corresponding to the lowermost portion of the protection layers 34. The first protection layer 22 may include or may be an epoxy resin layer or a polyimide layer. For example, the wiring pad layer 26 may be directly on and may contact the first protection layer 22. In some embodiments, when the first protection layer 22 includes an epoxy resin layer, a modulus of elasticity thereof may be about 15 to about 30 GPa, and when including a polyimide layer, it may be about 1 to about 10 GPa. The wiring pad layer 26 may be circular in a plan view as illustrated in FIG. 2. The wiring pad layer 26 may have a width (or diameter) W1. The wiring pad layer 26 may include, for example, a copper layer.

The medium level unit LE2 may include a second protection layer 24, including a wire-exposing hole H1, on the first protection layer 22. The wire-exposing hole H1 may expose the wire pad layer 26, with respect to the second protection layer 24. The wire-exposing hole H1 may have a width (or diameter) W2H. The second protection layer 24 may correspond to an intermediate portion of the protection layers 34. A modulus of elasticity of a material of the second protection layer 24 may be the same as or greater than that of the first protection layer 22. The second protection layer 24 may include an upper surface 24f and a lower surface 24r. The second protection layer 24 may include or may be an epoxy resin layer. In some embodiments, when the second protection layer 24 is an epoxy resin layer, a modulus elasticity of the second protection layer 24 may be about 15 GPa to about 30 GPa.

The medium level unit LE2 may include a post layer 28 formed in the wire-exposing hole H1 on the wiring pad layer 26. The post layer 28 may be circular in a plan view as illustrated in FIG. 2. The post layer 28 may be inside the wiring pad layer 26 in a plan view as illustrated in FIG. 2. The post layer 28 may have a single pillar (e.g., a single, continuous, unitary structure formed of a single material without any grain boundaries therein) which has the same upper and lower widths (or diameters) throughout, and has a circular shape in a plan view as illustrated in FIG. 1. The post layer 28 may be in the shape of a post.

The post layer 28 may have a width (or diameter) (e.g., an outer width or diameter) W2. The width (or diameter) W2 of the post layer 28 may be less than the width (or diameter) W1 of the wiring pad layer 26. The post layer 28 may have a single unitary structure in which upper and lower widths (or diameters) W2 are the same. For example, the post layer 28 may have a single unitary structure in which upper and lower widths (or diameters) W2 in the upper portion and lower portion of the post layer 28 are the same. The post layer 28 may include or may be a metal layer.

The post layer 28 may include a lower surface 28r connected to the first protection layer 22 (e.g., through wiring pad layer 26), and an upper surface 28f that contacts the barrier layer 32 and a third protective layer 30. Note, the "upper" and "lower" surfaces here are described in the context of the medium level unit LE2. If described as part of the semiconductor package 1, the opposite designations (e.g., lower surface 28f and upper surface 28r) may be used. In general, terms such as "first" and "second" may be used to describe different surfaces. Ordinal numbers such as "first," "second," "third," etc. may be used simply as labels of certain elements, to distinguish such elements, from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). The upper surface 28f of the post layer 28 may be a flat surface. The upper surface 28f of the post layer 28 may be coplanar with the upper surface 24f of the second protection layer 24. The post layer 28 may be formed by using a planarization process after filling a metal material in the wire-exposing hole H1 in the second protection layer 24. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The medium level unit LE2 may include the third protection layer 30 including a post-exposing hole H2 exposing the post layer 28 in the second protection layer 24. The post-exposing hole H2 may have a width (or diameter) W4H. The third protection layer 30 may correspond to the uppermost portion of the protection layers 34.

A width (or diameter) W4H of the post-exposing hole H2 (e.g. a minimum width of the post-exposing hole H2, or width where it abuts the post layer 28) may be less than the width (or the diameter) W2H of the wire-exposing hole H1. The lower width (or diameter) W4H of the post-exposing hole H2 may be less than an upper width (or diameter) W4H' thereof. The third protection layer 30 may include may be formed of a material of a lower modulus of elasticity compared to the second protection layer 24. The third protection layer 30 may include or may be a polyimide layer. In some embodiments, the third protection layer 30 may have a modulus of elasticity of about 1 to about 10 GPa when a polyimide layer is used to form the third layer 30. The widths described herein are in the X or Y, horizontal direction, unless noted otherwise. Thicknesses described herein are in the Z, vertical direction (perpendicular to the X, horizontal direction), unless noted otherwise.

The medium level unit LE2 may include the barrier layer 32 formed in the post-exposing hole H2 on the post layer 28. The barrier layer 32 may extend outward from the post-exposing hole H2 in the third protection layer 30. The barrier layer 32 may have a width (or diameter) W3. The barrier layer 32 may include or may be a copper layer, a nickel layer, or a gold layer, for example. A lower width (or lower diameter) W4 of the barrier layer 32 may be less than the upper width (or upper diameter) W3 thereof. The entire barrier layer 32 may be considered part of the medium-level unit LE2, even though part of it extends vertically beyond the dashed line shown in FIG. 1.

As illustrated in FIG. 1, in the medium level unit LE2, the width (or diameter) W2 of the post layer 28 may be the same as the width (or diameter) W3 of the barrier layer 32. In other embodiments, unlike as illustrated in FIG. 1, in the medium level unit LE2, the width (or diameter) W2 of the post layer 28 may be less than the width (or diameter) W3 of the barrier layer 32. In addition, a thickness T1 of the post layer 28 may be less than a maximum thickness T2 of the solder ball 36.

In some embodiments, the width (or diameter) W2 of the post layer 28 may have a value in a range from about 70% to about 100% of the width (or diameter) W3 of the barrier layer 32. In some embodiments, the width (or diameter) W4H (e.g., a minimum width) of the post-exposing hole H2 may have a value of about 65% of the width (or diameter) W3 of the barrier layer 32. In some embodiments, the thickness T1 of the post layer 28 may have a value of about 10% to about 50% of the thickness T2 of the solder ball 36. The thickness here is in the Z direction and width is in the X direction perpendicular to the Z direction.

In some embodiments, the width (or diameter) W2 of the post layer 28 may be about 100 in to about 300 μm. In some embodiments, the thickness T1 of the post layer 28 may be about 10 in to about 90 μm. The thickness T2 (e.g., a maximum thickness in the Z direction) of the solder ball may be about 100 μm to about 180 μm. The width (or diameter) W3 (e.g., outermost width) of the barrier layer 32 may be about 180 μm to about 200 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The semiconductor package 1 configured as described above according to example embodiments of the inventive concept may include the medium level unit LE2 including the plurality of protection layers 34, and the modulus of elasticity of the second protection layer 24 of the protection layers 34 may be greater than the modulus of elasticity of the third protection layer 30. In addition, the semiconductor package 1 according to an embodiment of the inventive concept may include the post layer 28 having the width W2 that is greater than the width (or diameter) W4H of the post-exposing hole H2 and equal to or less than the width (or diameter) W3 of the barrier layer 32.

Accordingly, the semiconductor package 1 according to aspects of the inventive concept may improve the reliability thereof, by reducing stress applied to the semiconductor chip 20 when or after the semiconductor chip 20 is physically or electrically connected to the circuit board by using the solder ball 36, for example, by reducing mechanical shock stress or thermal shock stress.

In addition, the semiconductor package 1 according to aspects of the inventive concept may improve the reliability thereof, by reducing stress applied to the vicinity of edges at both ends of the wiring pad layer 26 constituting the semiconductor chip 20, as illustrated by the reference number 38 in FIG. 1, for example, mechanical impact stress or thermal shock stress. The mechanical impact stress may include drop impact stress.

Figure 3:
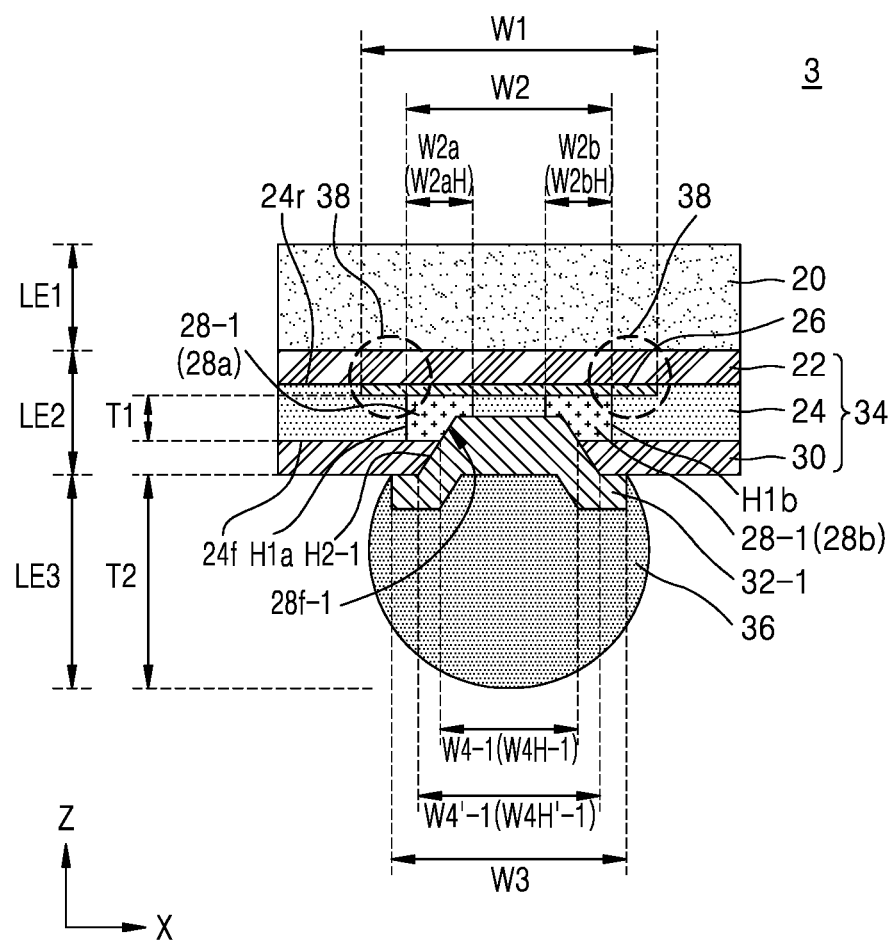
FIG. 3 is a cross-sectional view of a semiconductor package according to an embodiment of the inventive concept.
Figure 4:
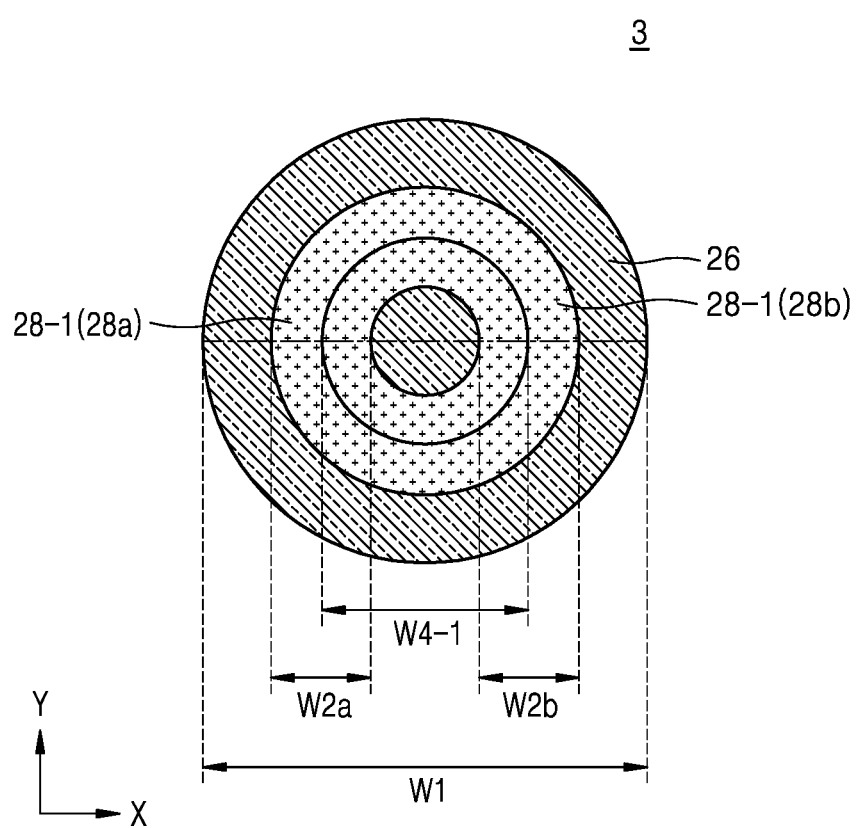
FIG. 4 is a plan layout diagram of a wiring pad layer and a post layer in FIG. 3, according to an example embodiment.

FIG. 3 is a cross-sectional view of a semiconductor package according to an embodiment of the inventive concept, and FIG. 4 is a plan layout diagram of a wiring pad layer and a post layer in FIG. 3.

The semiconductor package 3 of FIGS. 3 and 4 may be the same as a semiconductor package 1 of FIGS. 1 and 2 except that structures of a post layer 28-1 and a barrier layer 32-1 are different than in the semiconductor package 1 of FIGS. 1 and 2. In FIGS. 3 and 4, the same or similar reference numerals as in FIGS. 1 and 2 may denote the same or similar members. In FIGS. 3 and 4, the same or similar descriptions given with reference to FIGS. 1 and 2 are briefly given or omitted for convenience.

The semiconductor package 3 may include the chip level unit LE1, the medium level unit LE2, and the solder ball unit LE3. The medium level unit LE2 may include the plurality of protection layers 34 on the chip level unit LE1. The wiring pad layer 26 may be on the first protection layer 22 corresponding to the lowermost portion of the protection layers 34. The wiring pad layer 26 may be circular in a plan view as illustrated in FIG. 4. The wiring pad layer 26 may have the width (or diameter) W1.

The medium level unit LE2 may include a second protection layer 24 including a plurality of wire-exposing holes H1a and H1b, which expose the wiring pad layer 26 on the first protection layer 22. The wire-exposing holes H1a and H1b may be apart from each other. The wire-exposing holes H1a and H1b may have widths W2aH and W2bH, respectively. W2aH and W2bH may have the same widths as each other. The wire-exposing holes H1a and H1b are shown in a cross-sectional view, and may form a single trench having a ring shape, when viewed in a plan view or perspective view. The width of the trench may be W2aH or W2bH (which may be the same width). The outer width of the ring formed by the trench may be W2.

The medium level unit LE2 may include the post layer 28-1 formed in the wire-exposing holes H1a and H1b in the wiring pad layer 26. The post layer 28-1 may, as illustrated in FIG. 3, include a first post portion 28a and a second post portion 28b formed in the wire-exposing holes H1a and H1b, respectively, when viewed from a cross-sectional view. The post layer 28-1 may be a ring-shaped (e.g., circular) pillar that is vertically empty in the middle, when viewed in a plan or perspective view. The post layer 28-1 may be a single, continuous structure of a ring shape, formed of a single, continuous material. The post layer 28-1 may be inside an outer diameter of the wiring pad layer 26, when viewed in a plan view.

The first post portion 28a may have a width W2a. The second post portion 28b may have a width W2b. W2a and W2b may be the same width. The post layer 28-1 may have the outer width (outer diameter) W2 (e.g., an outer diameter of the ring shape). The outer width (or outer diameter) W2 of the post layer 28-1 may be less than the width (or diameter) W1 of the wiring pad layer 26.

The medium level unit LE2 may include the third protection layer 30 including a post-exposing hole H2-1 that exposes the post layer 28-1 in the second protection layer 24. The post-exposing hole H2-1 may also expose the second protection layer 24, and at the same time, may be tapered in a direction toward the post layer 28-1 and the second protective layer 24. The post-exposing hole H2-1 may have a width (or diameter) W4H-1 (e.g. minimum width, or width where it abuts the post layer 28-1). The width (or diameter) W4H-1 of the post-exposing hole H2-1 may be less than the outer width (or diameter) W2 of the post layer 28-1. The lower width (or lower diameter) W4H-1 of the post-exposing hole H2-1 may be less than an upper width (or upper diameter) W4H'-1 thereof. The upper width W4H'-1 (e.g., maximum width) may also be less than the outer width (or diameter) W2 of the post layer 28-1. In this manner, the post-exposing hole H2-1 may include a first opening (e.g., where it abuts the post layer 28-1) and a second opening (opposite the first opening), and both the first and second opening may have a width less than the outer width W2 of the post layer 28-1.

The medium level unit LE2 may include a barrier layer 32-1 formed in the post-exposing hole H2-1 on a post layer 28-1. The barrier layer 32-1 may also contact the second protection layer 24, and may extend into a recess in the post layer 28-1 and the second protection layer 24. In one embodiment, an upper surface 28f-1 of the post layer 28-1 may be a curved surface (or non-flat surface) 24f The barrier layer 32-1 may have a width (or diameter) W4-1. The lower width (or lower diameter) W4-1 of the barrier layer 32-1 may be less than an upper width (or upper diameter) thereof, or W3.

As illustrated in FIG. 3, in the medium level unit LE2, the outer width (or diameter) W2 of the post layer 28-1 may be less than a width (or diameter) W3 of the barrier layer 32-1. In addition, the thickness T1 of the post layer 28-1 may be less than the maximum thickness T2 of the solder ball 36.

In some embodiments, the outer width (or diameter) W2 of the post layer 28-1 may be in a range of about 70% to about 100% of the width (or diameter) W3 of the barrier layer 32-1. In some embodiments, the width (or diameter) W4H-1 of the post-exposing hole H2-1 may be about 65% of the width (or diameter) of the barrier layer 32-1, or W3. In some embodiments, the thickness T1 (e.g., in the Z direction) of the post layer 28-1 may be about 10% to about 50% of the maximum thickness T2 of the solder ball 36.

As described above, the semiconductor package 3 according to certain embodiments of the inventive concept may have increased reliability, by reducing stress applied to the vicinity of edges at both ends of the wiring pad layers 26 constituting the semiconductor chip 20 as illustrated by the reference numeral 38 in FIG. 3, for example, mechanical impact stress or thermal impact stress.

Figure 5:
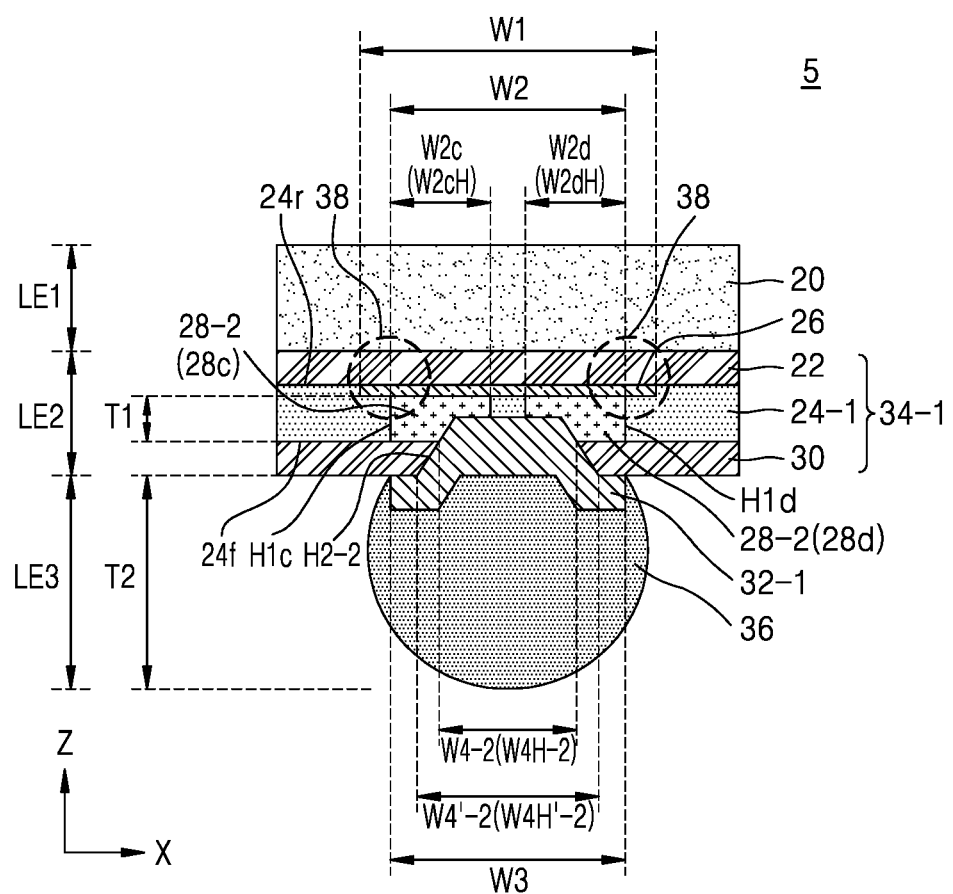
FIG. 5 is a cross-sectional view of a semiconductor package according to an embodiment of the inventive concept.
Figure 6:
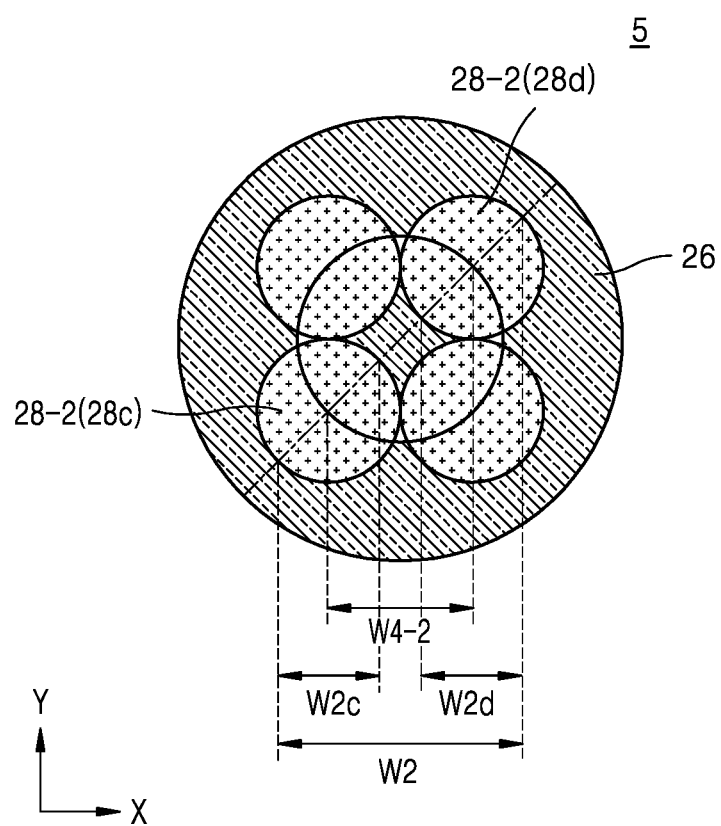
FIG. 6 is a plan layout diagram of a wiring pad layer and a post layer in FIG. 5, according to an example embodiment.

FIG. 5 is a cross-sectional view of a semiconductor package according to an embodiment of the inventive concept, and FIG. 6 is a plan layout diagram of a wiring pad layer and a post layer in FIG. 5.

A semiconductor package 5 of FIGS. 5 and 6 may be the same as the semiconductor package 3 of FIGS. 3 and 4 except that structures of a post layer 28-2 and second protection layer 24-1 are different than in the semiconductor package 3 of FIGS. 3 and 4. In FIGS. 5 and 6, the same or similar reference numerals as in FIGS. 1 through 4 may denote the same or similar members. In FIGS. 5 and 6, the same or similar descriptions given with reference to FIGS. 1 through 4 are briefly given or omitted for convenience.

The semiconductor package 5 may include the chip level unit LE1, the medium level unit LE2, and the solder ball unit LE3. The medium level unit LE2 may include the plurality of protection layers 34-1 on the chip level unit LE1. The wiring pad layer 26 may be on the first protection layer 22 corresponding to the lowermost portion of the protection layers 34-1. The wiring pad layer 26 may be circular in a plan view as illustrated in FIG. 5. The wiring pad layer 26 may have the width (or diameter) W1.

The medium level unit LE2 may include the second protection layer 24-1 including a plurality of wire-exposing holes H1c and H1d, in a plan-view, which expose the wiring pad layer 26 on the first protection layer 22. The wire-exposing holes H1c and H1d may be apart from each other in a cross-sectional view, and may have a be part of a ring-shaped trench in a plan view of perspective view.

The wire-exposing holes H1c and H1d may have widths (or diameters) W2cH and W2dH, respectively. The widths (or diameters) W2cH and W2dH of the wire-exposing holes H1c and H1d may be different from the widths (or diameters) W2aH and W2cH of the wire-exposing holes H1a and H1b in FIG. 3, respectively. The widths (or diameters) W2cH and W2dH of the wire-exposing holes H1c and H1d may be greater than the widths (or diameters) W2aH and W2cH of the wire-exposing holes H1a and H1b in FIG. 3, respectively. From a plan or perspective view, the wire-exposing holes H1c and H1d may be part of circular holes, for example, formed in a square pattern as shown in FIG. 6 (rather than a single ring-shape as shown in FIG. 4). Though four circular holes are shown, other arrangements may be used, such as three, five, six, or other numbers or holes.

The medium level unit LE2 may include a post layer 28-2 formed in the wire-exposing holes H1c and H1d on the wiring pad layer 26. The post layer 28-2 may, as illustrated in FIG. 5, include sub-post layers 28c and 28d formed in the wire-exposing holes H1c and H1d, respectively.

The post layer 28-2 may include a plurality of sub-post layers 28c and 28d each arranged in a circular shape as illustrated in FIG. 6. In FIG. 6, the post layer 28-2 is illustrated to include four sub-post layers 28c and 28d, but may include more or less than four sub-post layers as needed. Each of the sub-post layers 28c and 28d may have a single structure of a circular type in a plan view. Each of the sub-post layers 28c and 28d may be a circular pillar. The post layer 28-2 may be inside an outer diameter of the wiring pad layer 26, when viewed in a plan view.

The sub-post layer 28c may have a width (or diameter) W2c. The sub-post layer 28d may have a width (or diameter) W2d. W2c and W2d may be the same width. The post layer 28-2 may have the outer width (diameter) W2 (e.g., a maximum width). The outer width (or outer diameter) W2 of the post layer 28-2 may be less than the width (or diameter) W1 of the wiring pad layer 26.

The medium level unit LE2 may include the third protection layer 30 including a post-exposing hole H2-2 that exposes the post layer 28-2 in the second protection layer 24-1. The post-exposing hole H2-2 may also expose the second protection layer 24-1, and at the same time, may be tapered in a direction toward the post layer 28-2 and the second protective layer 24-1. The post-exposing hole H2-2 may have a width (or diameter) W4H-2.

The width (or diameter) W4H-2 of the post-exposing hole H2-2 may be less than the outer width (or diameter) W2 of the post layer 28-2. The lower width (or lower diameter) W4H-2 of the post-exposing hole H2-2 may be less than an upper width (or upper diameter) W4H'-2 thereof. The post layer 28-2 may include the plurality of sub-post layers 28c and 28d arranged in a circular, or ring, shape along an edge of the post-exposing hole H2-2 as illustrated in FIG. 6.

The medium level unit LE2 may include a barrier layer 32-1 formed in the post-exposing hole H2-2 on the post layer 28-2. The barrier layer 32-1 may also contact the second protection layer 24-1, and may be recessed into the post layer 28-2 and the second protection layer 24-1. The barrier layer 32-1 may have a width (or diameter) W4-2. The lower width (or lower diameter) W4-2 of the barrier layer 32-1 may be less than an upper width (or upper diameter) W3.

As illustrated in FIG. 5, in the medium level unit LE2, the outer width (or outer diameter) W2 of the post layer 28-2 may be the same as the width (or diameter) W3 of the barrier layer 32-1. In addition, the thickness T1 of the post layer 28-2 may be less than the maximum thickness T2 of the solder ball 36.

In some embodiments, the outer width (or diameter) W2 of the post layer 28-2 may be in a range of about 70% to about 100% of the width (or diameter) W3 of the barrier layer 32-1. In some embodiments, the width (or diameter) W4H-2 of the post-exposing hole H2-2 may be at a level of about 65% of the width (or diameter) W3 of the barrier layer 32-1. In some embodiments, the thickness T1 of the post layer 28-2 may be about 10% to about 50% of the maximum thickness T2 of the solder ball 36.

As described above, the semiconductor package 5 according to an embodiment of the inventive concept configured as described above may increase the reliability thereof, by reducing stress applied to the vicinity of edges at both ends of the wiring pad layers 26 constituting the semiconductor chip 20 as illustrated by the reference numeral 38 in FIG. 5, for example, mechanical impact stress or thermal impact stress.

Figure 7:
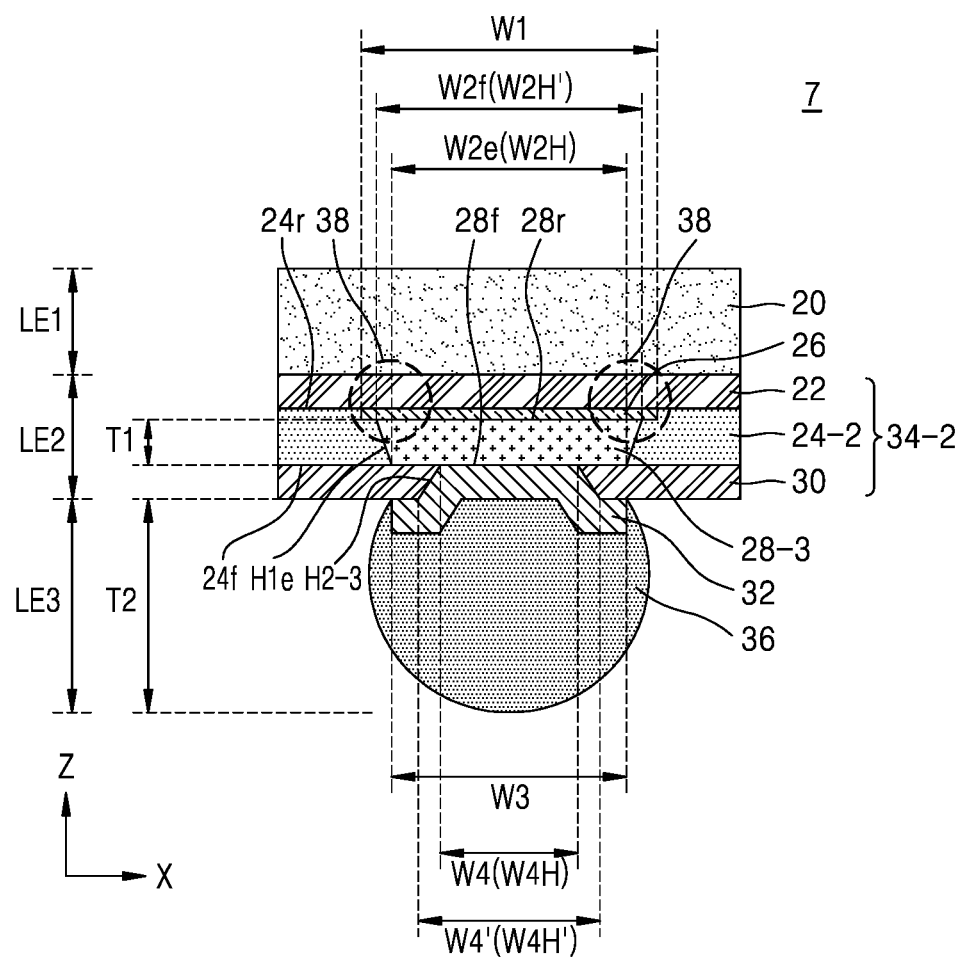
FIG. 7 is a cross-sectional view of a semiconductor package according to an embodiment of the inventive concept.
Figure 8:
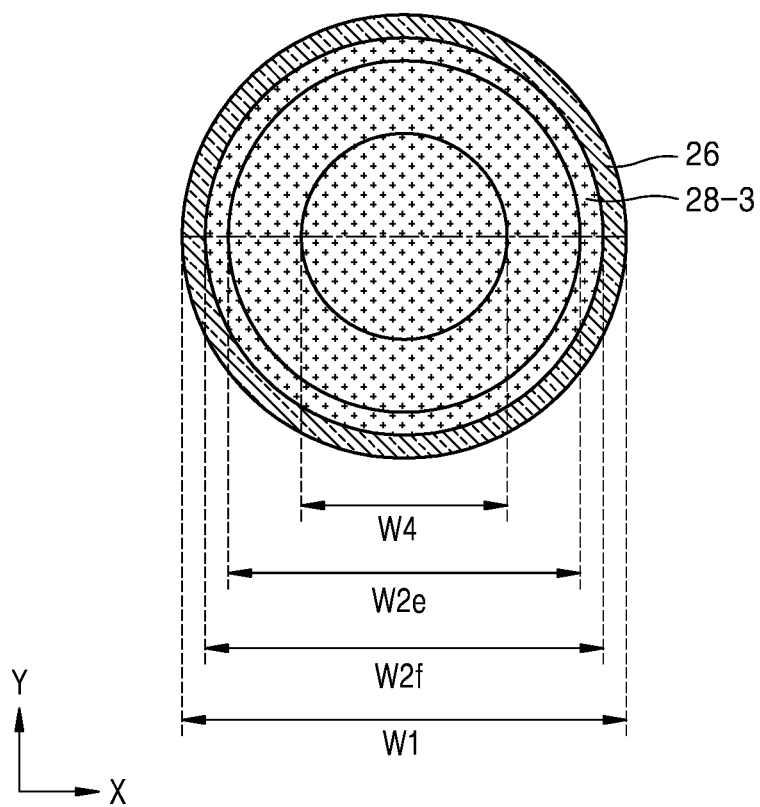
FIG. 8 is a plan layout diagram of a wiring pad layer and a post layer in FIG. 7, according to an example embodiment.

FIG. 7 is a cross-sectional view of a semiconductor package according to an embodiment of the inventive concept, and FIG. 8 is a plan layout diagram of a wiring pad layer and a post layer in FIG. 7.

A semiconductor package 7 of FIGS. 7 and 8 may be the same as the semiconductor package 1 of FIGS. 1 and 2 except that a structure of a post layer 28-3 and protection layer 24-2 is different than in the semiconductor package 1 of FIGS. 1 and 2. In FIGS. 7 and 8, the same or similar reference numerals as in FIGS. 1 and 2 may denote the same or similar members. In FIGS. 7 and 8, the same or similar descriptions given with respect to FIGS. 1 and 2 are briefly given or omitted for convenience.

The semiconductor package 7 may include the chip level unit LE1, the medium level unit LE2, and the solder ball unit LE3. The medium level unit LE2 may include a plurality of protection layers 34-2 on the chip level unit LE1. The wiring pad layer 26 may be on a first protection layer 22 corresponding to the lowermost portion of the protection layers 34-2. The wiring pad layer 26 may be circular in a plan view as illustrated in FIG. 8. The wiring pad layer 26 may have a width W (or diameter).

The medium level unit LE2 may include a second protection layer 24-2 including a wire-exposing hole H1e exposing the wiring pad layer 26 on the first protection layer 22. The wire-exposing hole H1e may have a width (or diameter) W2H'. A lower width (or diameter) W2H of the wire-exposing hole H1e may be greater than an upper width (or diameter) W2H.

The medium level unit LE2 may include a post layer 28-3 formed in the wire-exposing hole H1e on the wiring pad layer 26. The post layer 28-3 may be circular in a plan view as illustrated in FIG. 8. The post layer 28-3 may be inside an outer circumference of the wiring pad layer 26 in a plan view as illustrated in FIG. 8. The post layer 28-3 may have a circular shape as illustrated in FIG. 8.

The post layer 28-3 may have a lower width (or diameter) W2f and an upper width (or diameter) W2e. The lower width (or diameter) W2f of the post layer 28-3 may be greater than the upper width (or diameter) W2e. The post layer 28-3 may be a single, continuous structure having the upper and lower widths (or diameters) W2e and W2f that are different from each other.

The widths (or diameters) W2e and W2f of the post layer 28-3 may be less than the width (or diameter) W1 of the wiring pad layer 26. An upper surface 28f of the post layer 28-3 may be a flat surface. The upper surface 28f of the post layer 28-3 may be coplanar with an upper surface of the second post layer 24-2.

The medium level unit LE2 may include the third protection layer 30 including a post-exposing hole H2-3 exposing the post layer 28-3 in the second protection layer 24-2. The post-exposing hole H2-3 may have a width (or diameter) W4H.

The width (or diameter) W4H of the post-exposing hole H2-3 may be less than the widths (or diameters) W2H and W2H' of the wire-exposing hole H1e. For example, a maximum width of the post-exposing hole H2-3 may be less than a minimum width of the wire-exposing hole H1e. The lower width (or lower diameter) W4H of the post-exposing hole H2 may be less than the upper width (or upper diameter) W4H' thereof.

The medium level unit LE2 may include the barrier layer 32 formed in the post-exposing hole H2-3 on the post layer 28-3. The barrier layer 32 may have the width (or diameter) W3. A lower width W4 (or lower diameter) at a bottom-most surface of the barrier layer 32 may be less than the upper width (or upper diameter) W3 at an upper-most surface of the barrier layer 32.

As illustrated in FIG. 7, in the medium level unit LE2, the widths (or diameters) W2e and W2f of the post layer 28-3 may be less than the width (or diameter) W3 of the barrier layer 32. In addition, the thickness T1 of the post layer 28-3 may be less than the maximum thickness T2 of the solder ball 36.

In some embodiments, the outer widths (or diameters) W2e and W2f of the post layer 28-3 may be in a range of about 70% to about 100% of the width (or diameter) W3 of the barrier layer 32. In some embodiments, the width (or diameter) W4H of the post-exposing hole H2-3 may be about 65% of the width (or diameter) W3 of the barrier layer 32. In some embodiments, the thickness T1 of the post layer 28-3 may be about 10% to about 50% of the maximum thickness T2 of the solder ball 36.

As described above, the semiconductor package 7 according to an embodiment of the inventive concept configured as described above may increase the reliability thereof, by reducing stress applied to the vicinity of edges at both ends of the wiring pad layers 26 constituting the semiconductor chip 20 as illustrated by the reference numeral 38 in FIG. 7, for example, mechanical impact stress or thermal impact stress.

Figure 9:
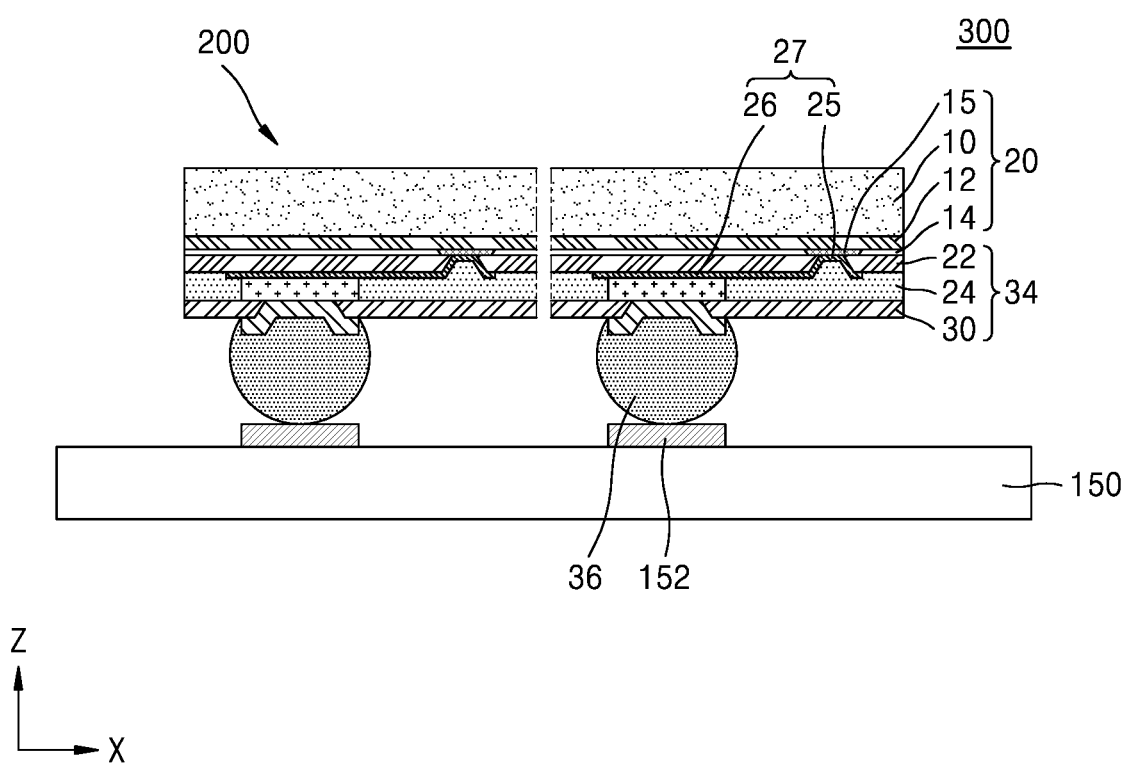
FIG. 9 is a cross-sectional view of a semiconductor package product including a semiconductor package, according to an embodiment of the inventive concept.
Figure 10:
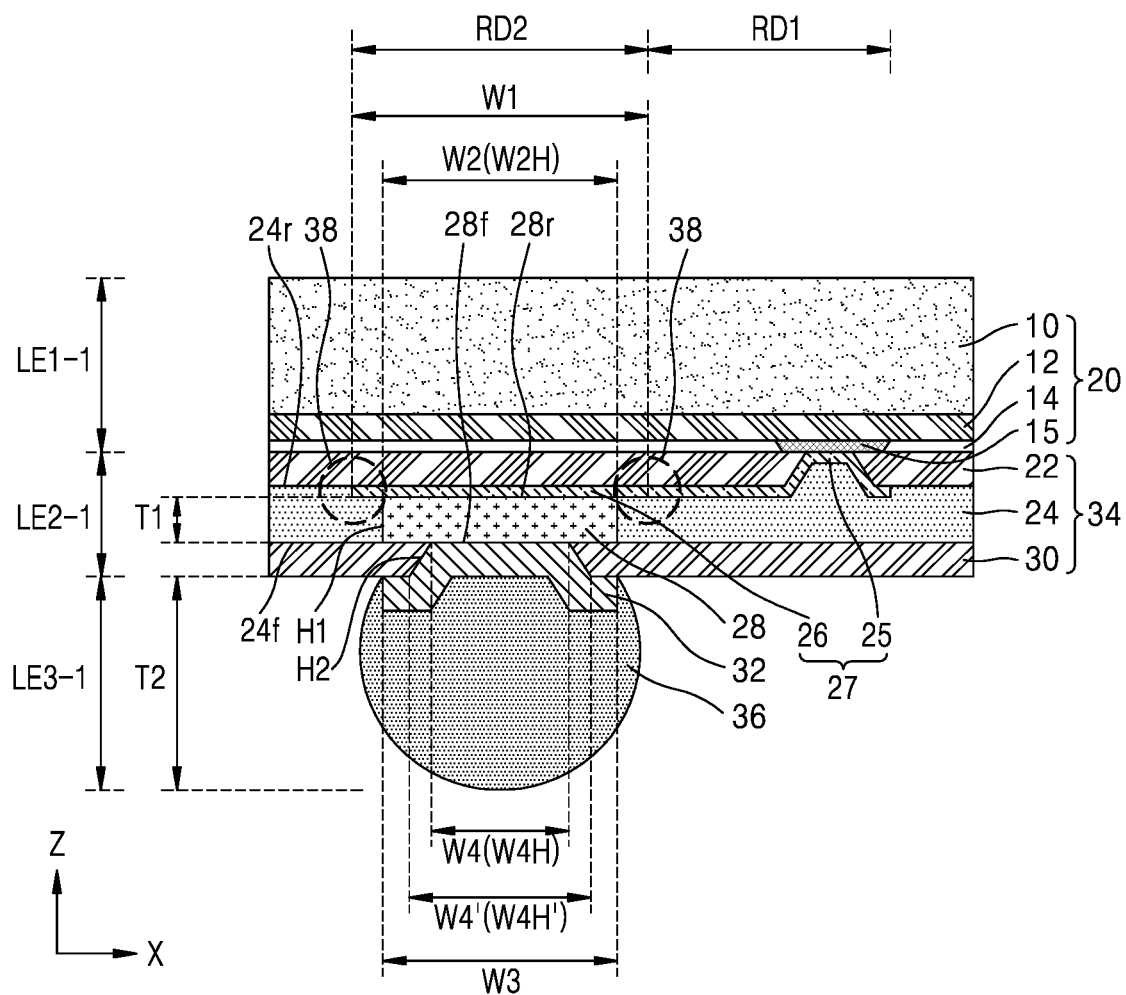
FIG. 10 is a cross-sectional view of the semiconductor package in FIG. 9, according to an example embodiment.
Figure 11:
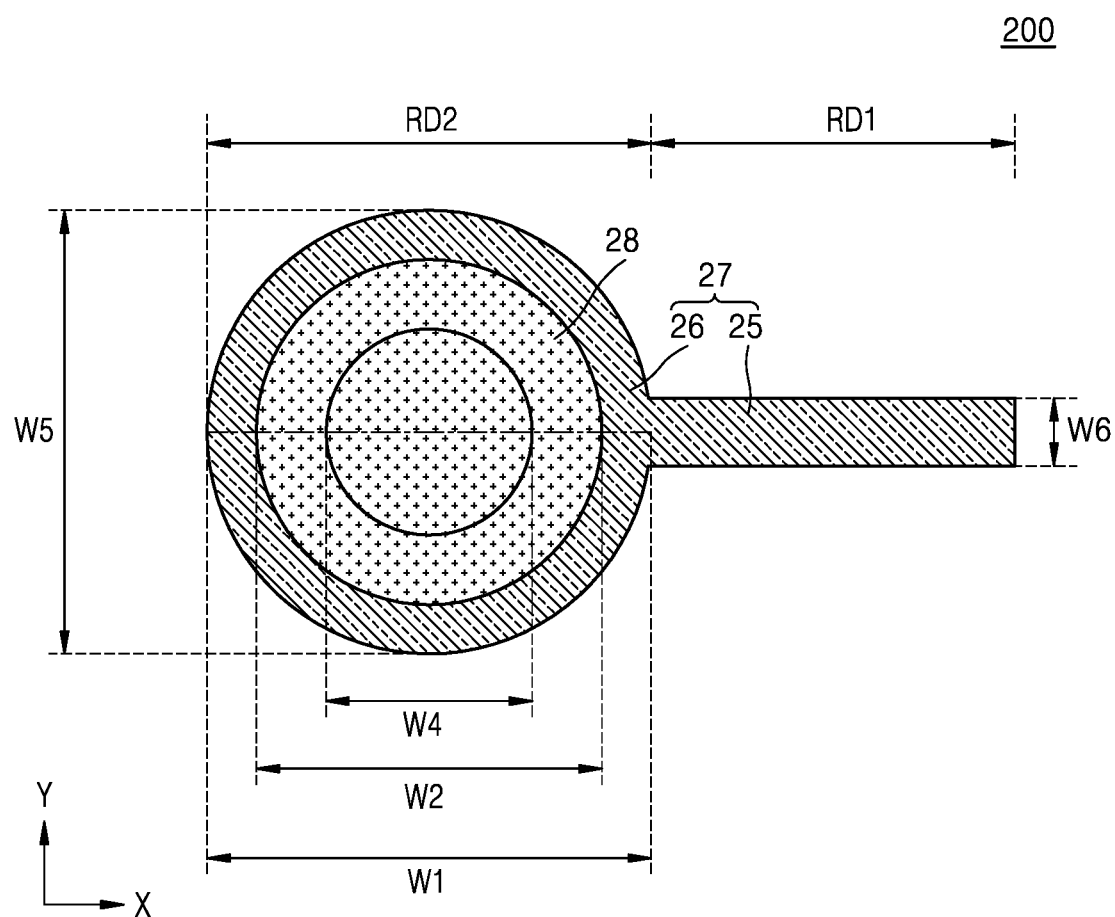
FIG. 11 is a plan layout diagram of a redistribution structure and a post layer of a semiconductor package in FIG. 10.
Figure 12:
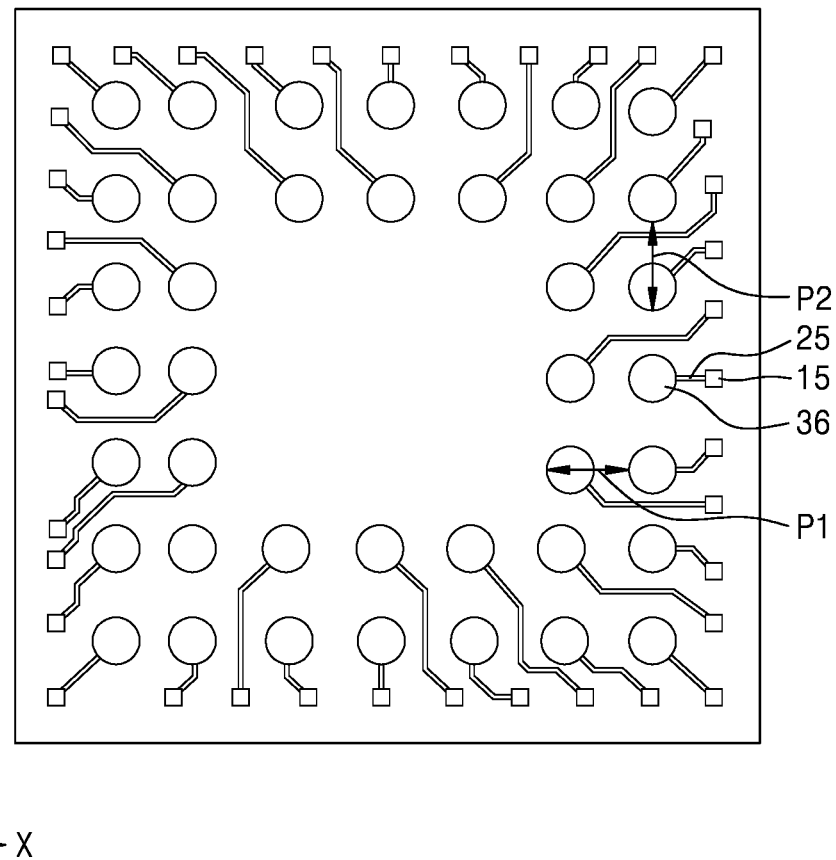
FIG. 12 is a plan cross-sectional view of the semiconductor package in FIG. 9, according to an example embodiment.

FIG. 9 is a cross-sectional view of a semiconductor package product including a semiconductor package, according to an embodiment of the inventive concept, FIG. 10 is a cross-sectional view of the semiconductor package in FIG. 9, FIG. 11 is a plan layout diagram of a redistribution structure and a post layer of the semiconductor package in FIG. 10, and FIG. 12 is a plan cross-sectional view of the semiconductor package in FIG. 9.

A semiconductor package 200 included in a semiconductor package product 300 may employ the semiconductor package 1 of FIG. 1. In this manner, the semiconductor package 200 in FIGS. 9 through 12 may employ the semiconductor package 1 of FIG. 1. The semiconductor package product 300 may be, for example, a semiconductor package, or may be a memory module. For example, semiconductor package product 300 may be a memory module, such as a single in-line memory module (SIMM) or may be part of a dual in-line memory module (DIMM).

The semiconductor package 200 in FIGS. 9 through 12 may be the same as the semiconductor package 1 of FIGS. 1 and 2 except that the detailed configuration of the semiconductor chip 20 and a redistribution structure 27 are further included as compared to the semiconductor package 1 of FIGS. 1 and 2. In FIGS. 9 and 12, the same or similar reference numerals as in FIGS. 1 and 2 may denote the same or similar members. In FIGS. 9 and 12, the same or similar descriptions given with reference to FIGS. 1 and 2 are briefly given or omitted for convenience.

As illustrated in FIG. 9, the semiconductor package product 300 may include a circuit substrate 150 and the semiconductor package 200. The circuit substrate 150 may include a printed circuit board. A connection pad 152 may be on the circuit substrate 150. The solder ball 36 of the semiconductor package 200 may be connected to the connection pad 152. The solder ball 36 of the semiconductor package 200 may be mechanically and electrically connected to the circuit substrate 150 via the connection pad 152.

The semiconductor package 200 may, as illustrated in FIG. 10, include a chip level unit LE1-1, a medium level unit LE2-1, and a solder ball unit LE3-1 in a cross-sectional view. The chip level unit LE1-1, the medium level unit LE2-1, and the solder ball unit LE3-1 may correspond to the chip level unit LE1, the medium level unit LE2, and the solder level unit LE3 in FIG. 1, respectively.

The chip level unit LE1-1 may include the semiconductor chip 20. The semiconductor chip 20 may include a chip circuit layer 12 on the semiconductor substrate 10, for example, a silicon layer (or silicon substrate). The chip circuit layer 12 may be at an active surface of the semiconductor chip 20. For convenience, the chip circuit layer 12 may be displayed as a single layer on the semiconductor substrate 10, but integrated circuit layers including a plurality of transistors, capacitors, and/or resistant elements may be formed on the semiconductor substrate 10. The semiconductor chip 20 may include a passivation layer 14 and a chip pad 15 formed on the chip circuit layer 12. The chip pad 15 may be insulated from other chip pads 15 by the passivation layer 14, and may be connected to the chip circuit layer 12. The passivation layer 14 may include, for example, a silicon nitride layer.

The medium level unit LE2-1 may include the redistribution structure 27, the post layer 28, the barrier layer 32, and the plurality of protection layers 34. The solder ball unit LE3-1 including the solder ball 36 may be on the medium level unit LE2-1. The medium level unit LE2-1 is described in detail.

The medium level unit LE2-1 may include the passivation layer 14 and the plurality of protection layers 34 formed on the chip pad 15. The first protection layer 22 may be formed on the passivation layer 14 and the chip pad 15. The first protection layer 22 may be formed on the chip circuit layer 12 and the chip pad 15. The first protection layer 22 may include, for example, an epoxy resin layer or a polyimide layer. The redistribution structure 27 connected to the chip pad 15 may be formed on the first protection layer 22.

The redistribution structure 27 may include the redistribution layer 25 extending from the chip pad 15 in a particular direction, for example, in a −X direction (that is, a horizontal direction), and extending to the wiring pad layer 26 (or the redistribution pad layer) at one end of the redistribution layer 25. The wiring pad layer 26 and redistribution layer 25 may be a single layer, including a post pad portion formed on post layer 28 and a chip pad portion formed on chip pad 15, and may be described as a redistribution layer. The redistribution layer 25 may penetrate the first passivation layer 22, be connected to the chip pad 15, and extend from the chip pad 15 on the first passivation layer 22 in the horizontal direction. As illustrated in FIG. 12, the redistribution layer 25 extending from the chip pad 15 may extend in the X direction and/or a Y direction, for example, in the horizontal direction, to be connected to the solder ball 36.

A pitch of the solder ball 36 (e.g., pitch between solder balls formed on the semiconductor package 200) may be a first pitch P1 in the X direction, and a second pitch P2 in the Y direction. In some embodiments, the pitch may have a value of about 0.2 mm to about 0.5 mm. In FIG. 12, the solder ball 36 is illustrated to be formed in a periphery portion of the semiconductor package 200, but it may also be formed in the central portion of the semiconductor package 200.

In the following description, because the wiring pad layer 26 is included in the redistribution structure 27, the wiring pad layer 26 may be referred to as the redistribution pad layer 26. The redistribution structure 27 may be separated into a redistribution layer region RD1 in which the redistribution layer 25 is arranged and a redistribution pad region RD2 in which the redistribution pad layer 26 is formed, as illustrated in FIGS. 10 and 11.

The redistribution pad region RD2 may have a width (or diameter) W5 in the Y-axis direction and the width (or diameter) W1 in the X-axis direction. In other words, the redistribution pad layer 26 may have the width (or diameter) W1 in the X-axis direction. A width (or length) W6 of the redistribution layer region RD1 in the Y-axis direction (described as a lengthwise direction) may be less than the width (or diameter) W5 of the redistribution pad region RD2 in the Y-axis direction. An item, layer, or portion of an item or layer described as extending "lengthwise" in a particular direction has a length in the particular direction and a width perpendicular to that direction, where the length is greater than the width.

The medium level unit LE2-1 may include a second protection layer 24 including the wire-exposing hole H1 exposing the redistribution pad layer 26 on the first protection layer 22. The second protection layer 24 may be formed on the redistribution structure 27 including the redistribution layer 25 and the redistribution pad layer 26, and on the first protection layer 22. A modulus of elasticity of a material of the second protection layer 24 may be the same as or greater than that of the first protection layer 22. The second protection layer 24 may include an epoxy resin layer. The wire-exposing hole H1 may have the width (or diameter) W2H.

The medium level unit LE2-1 may include a post layer 28 formed in the wire-exposing hole H1 on the redistribution pad layer 26. The post layer 28 may have the width (or diameter) W2. The outer width (or diameter) W2 of the post layer 28 may be less than the width (or diameter) W1 of the redistribution pad layer 26. The post layer 28 may have a single structure having the same upper and lower widths (or diameters) W2. The post layer 28 may include a metal layer.

The upper surface 28f of the post layer 28 may be a flat surface. The upper surface 28f of the post layer 28 may be coplanar with the upper surface of the second protection layer 24. The post layer 28 may be formed by using a planarization process after filling a metal material in the wire-exposing hole H1 in the second protection layer 24.

The medium level unit LE2-1 may include the third protection layer 30 including a post-exposing hole H2 exposing the post layer 28 in the second protection layer 24. The post-exposing hole H2 may have a width (or diameter) W4H. The width (or diameter) W4H of the post-exposing hole H2 may be less than the width (or diameter) W2H of the wire-exposing hole H1. The lower width (or lower diameter) W4H of the post-exposing hole H2 may be less than the upper width (or upper diameter) W4H' thereof. A modulus of elasticity of the third protection layer 30 may be less than that of the second protection layer 24. The third protection layer 30 may include, for example, a polyimide layer.

The medium level unit LE2-1 may include the barrier layer 32 formed in the post-exposing hole H2 on the post layer 28. The barrier layer 32 may have a width (or diameter) W3. The lower width W4 (or lower diameter) of the barrier layer 32 may be less than the upper width (or upper diameter) W3 thereof. In the medium level unit LE2-1, the width (or diameter) W2 of the post layer 28 may be less than the width (or diameter) W3 of the barrier layer 32. The thickness T1 of the post layer 28 may be less than the thickness T2 (e.g., a maximum thickness in the Z direction) of the solder ball 36.

As described above, the semiconductor package 200 according to an embodiment of the inventive concept configured as described above may increase the reliability thereof, by reducing stress applied to the vicinity of edges at both ends of the redistribution pad layers 26 constituting the semiconductor chip 20 as illustrated by the reference numeral 38 in FIG. 10 or applied to the redistribution layer 25, for example, mechanical impact stress or thermal impact stress, when or after the semiconductor chip 20 is physically or electrically connected to the circuit substrate 150 by using the solder ball 36.

Figure 13:
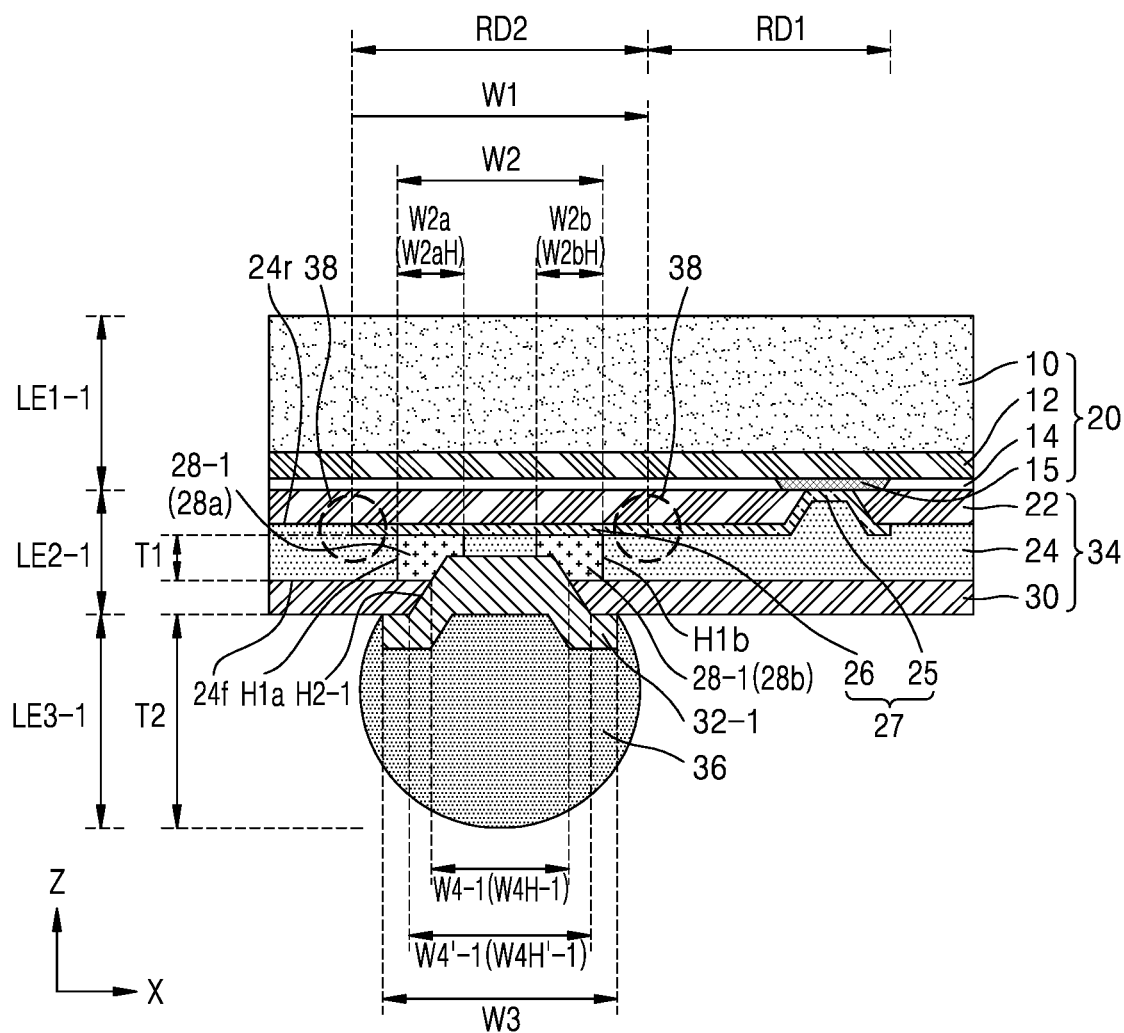
FIG. 13 is a cross-sectional view of a semiconductor package according to an embodiment of the inventive concept.
Figure 14:
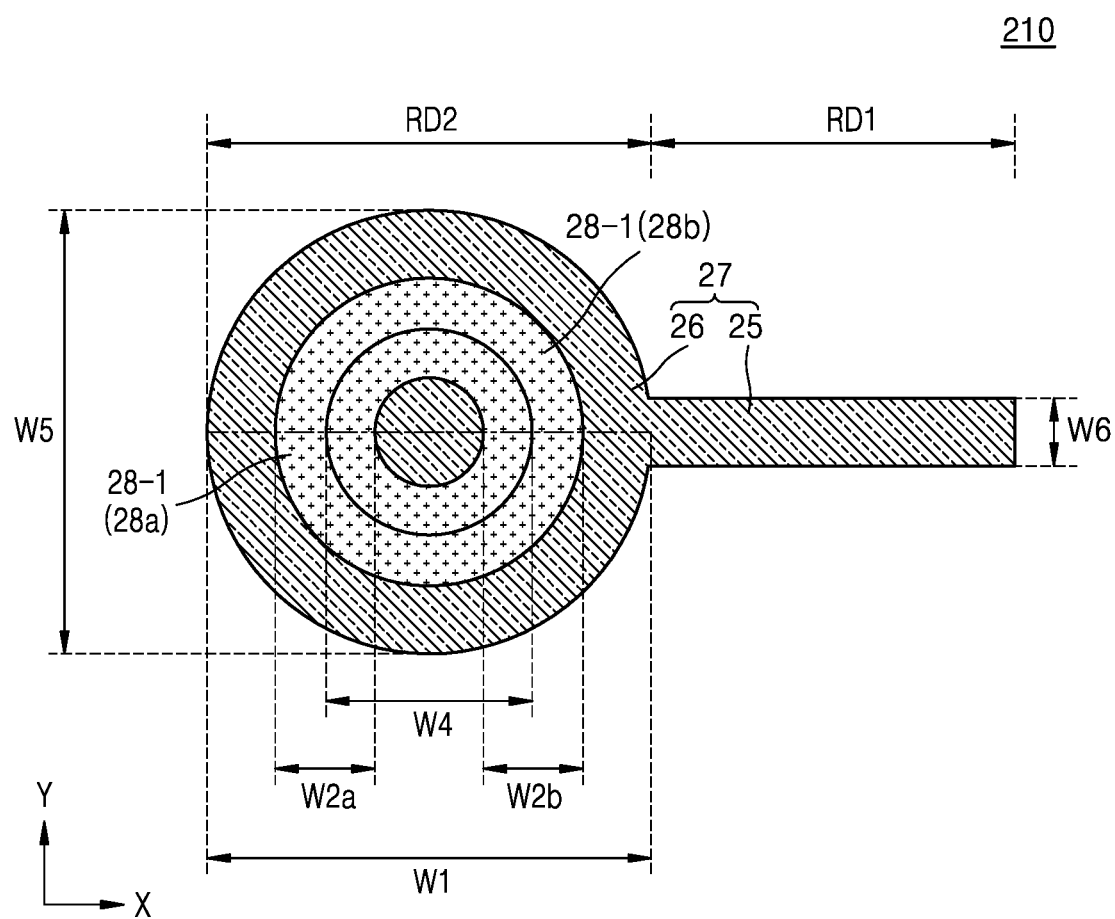
FIG. 14 is a plan layout diagram of a redistribution structure and a post layer of a semiconductor package in FIG. 13, according to an example embodiment.

FIG. 13 is a cross-sectional view of a semiconductor package according to an embodiment of the inventive concept, and FIG. 14 is a plan layout diagram of a redistribution structure and a post layer of the semiconductor package in FIG. 13.

A semiconductor package 210 of FIGS. 13 and 14 may be applied to the semiconductor package product 300 of FIG. 9. The semiconductor package 210 of FIGS. 13 and 14 may employ the semiconductor package 3 of FIGS. 3 and 4. The semiconductor package 210 in FIGS. 13 and 14 may be the same as the semiconductor package 3 of FIGS. 3 and 4 except that the detailed configuration of the semiconductor chip 20 and the redistribution structure 27 are further included as compared to the semiconductor package 3 of FIGS. 3 and 4.

In FIGS. 13 and 14, the same or similar reference numerals as in FIGS. 3, 4, and 9 through 12 may denote the same or similar members. In FIGS. 13 and 14, the same or similar descriptions given with respect to FIGS. 3, 4, and 9 through 12 are briefly given or omitted for convenience.

The semiconductor package 210 may, as illustrated in FIG. 13, include the chip level unit LE1-1, the medium level unit LE2-1, and the solder ball unit LE3-1 in a cross-sectional view. The chip level unit LE1-1 may include the semiconductor chip 20. The semiconductor chip 20 may include the passivation layer 14 and the chip pad 15 formed on the chip circuit layer 12 of the semiconductor substrate 10.

The medium level unit LE2-1 may include the redistribution structure 27, the post layer 28-1, the barrier layer 32-1, and the plurality of protection layers 34. The solder ball unit LE3-1 including the solder ball 36 may be on the medium level unit LE2-1. The medium level unit LE2-1 is described in detail.

The medium level unit LE2-1 may include the passivation layer 14 and the plurality of protection layers 34 formed on the chip pad 15. The first protection layer 22 may be formed on the passivation layer 14 and the chip pad 15. The redistribution structure 27 connected to the chip pad 15 may be formed on the first protection layer 22. The redistribution structure 27 may include the redistribution layer 25 extending from the chip pad 15 in a particular direction, for example, in the −X direction (for example, the horizontal direction), and the wiring pad layer 26 at one end of the redistribution layer 25.

The redistribution structure 27 may be separated into the redistribution layer region RD1 in which the redistribution layer 25 is arranged and the redistribution pad region RD2 in which the redistribution pad layer 26 is formed, as illustrated in FIGS. 13 and 14. For ease in explanation, these regions, and those described in previous embodiments, may be described as first and second regions of the redistribution structure 27.

The redistribution pad region RD2 may have the width (or diameter) W5 in the Y-axis direction and the width (or diameter) W1 in the X-axis direction. In other words, the redistribution pad layer 26 may have the width (or diameter) W1 in the X-axis direction. The value of W1 may be the same as that of W5. The width (or length) W6 of the redistribution layer region RD1 in the Y-axis direction may be less than the width (or diameter) W5 of the redistribution pad region RD2 in the Y-axis direction.

The medium level unit LE2-1 may include a second protection layer 24 including the plurality of wire-exposing holes H1a and H1b, from a cross-sectional view, which expose the wire pad layer 26 on the first protection layer 22. The wire-exposing holes H1a and H1b may have the widths W2aH and W2bH, respectively, and may together form a ring shape, from a plan view. The medium level unit LE2-1 may include the post layer 28-1 formed in the wire-exposing holes H1a and H1b in the wiring pad layer 26.

The post layer 28-1 may include the first and second post portions 28a and 28b, as viewed in a cross-sectional view. The post layer 28-1 may be a circular pillar that is vertically empty in the middle, and thus may have a donut shape. The post layer 28-1 may be a single continuous structure of a ring type in a plan view. The post layer 28-1 may be inside an outer circumference of the wiring pad layer 26 in a plan view.

The first post portion 28a may have the width W2a. The second post portion 28b may have the width W2b. The post layer 28-1 may have the outer width (diameter) W2. The outer width (or outer diameter) W2 of the post layer 28-1 may be less than the width (or diameter) W1 of the wiring pad layer 26.

The medium level unit LE2-1 may include the third protection layer 30 including the post-exposing hole H2-1 that exposes the post layer 28-1 in the second protection layer 24. The post-exposing hole H2-1 may also expose the second protection layer 24, and at the same time, may be tapered in a direction toward the post layer 28-1 and the second protective layer 24. The post-exposing hole H2-1 may have the width (or diameter) W4H-1. The width (or diameter) W4H-1 of the post-exposing hole H2-1 may be less than the outer width (or diameter) W2 of the post layer 28-1. The lower width (or lower diameter) W4H-1 of the post-exposing hole H2-1 may be less than the upper width (or upper diameter) W4H'-1 thereof.

The medium level unit LE2-1 may include a barrier layer 32-1 formed in the post-exposing hole H2-1 on the post layer 28-1. The barrier layer 32-1 may also contact the second protection layer 24, and may be recessed into the post layer 28-1 and the second protection layer 24. The barrier layer 32-1 may have the width (or diameter) W4-1. The lower width (or lower diameter) W4-1 of the barrier layer 32-1 may be less than the upper width (or upper diameter) W3 thereof.

As illustrated in FIG. 13, in the medium level unit LE2-1, the outer width (or diameter) W2 of the post layer 28-1 may be less than the width (or diameter) W3 of the barrier layer 32. In addition, the thickness T1 of the post layer 28-1 may be less than the thickness T2 of the solder ball 36.

As described above, the semiconductor package 210 according to an embodiment of the inventive concept configured as described above may increase the reliability thereof, by reducing stress applied to the vicinity of edges at both ends of the redistribution pad layers 26 constituting the semiconductor chip 20 as illustrated by the reference numeral 38 in FIG. 13 or applied to the redistribution layer 25, for example, mechanical impact stress or thermal impact stress, when or after the semiconductor chip 20 is physically or electrically connected to the circuit substrate 150 (refer to FIG. 9) by using the solder ball 36.

Figure 15:
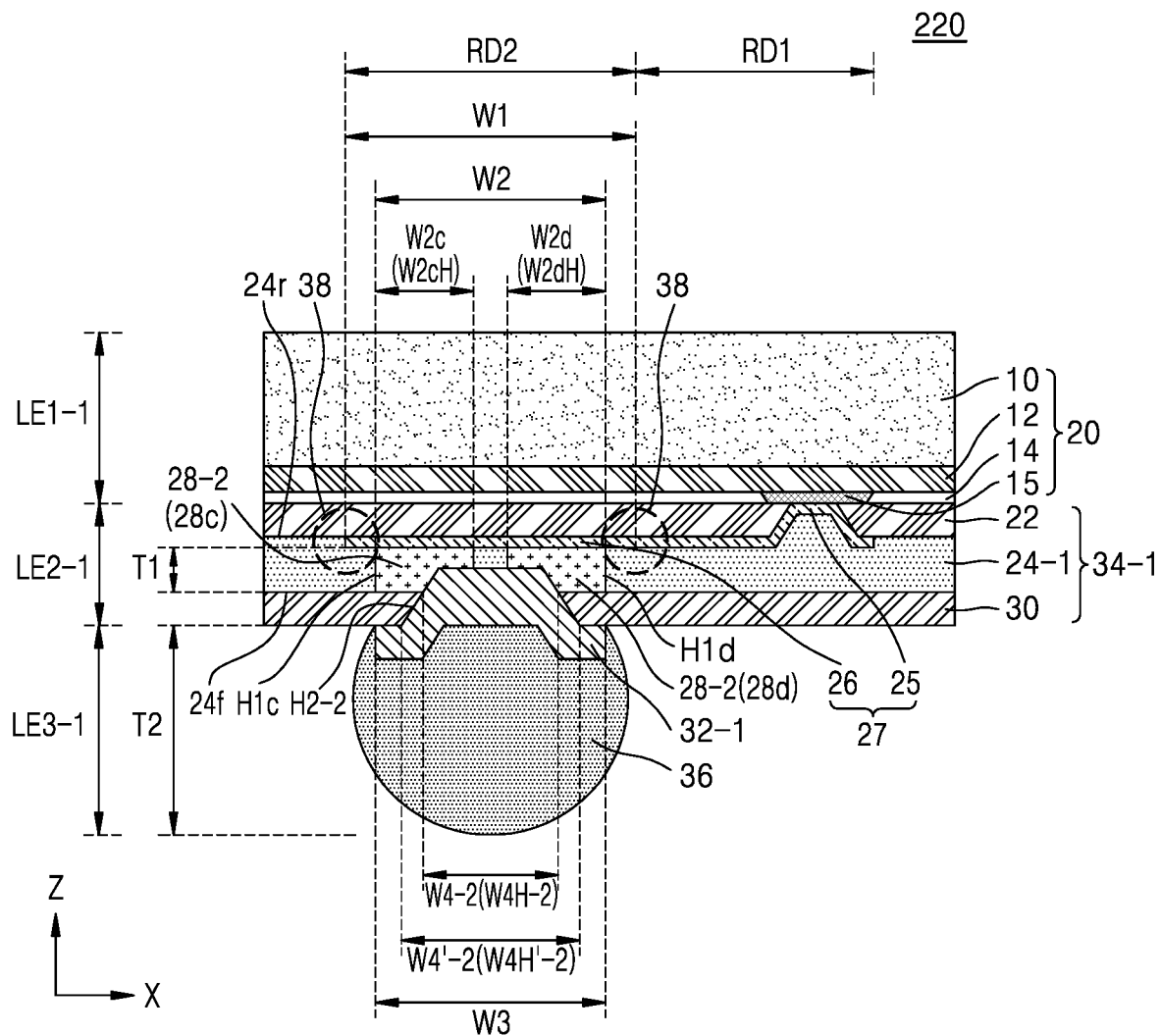
FIG. 15 is a cross-sectional view of a semiconductor package according to an embodiment of the inventive concept.
Figure 16:
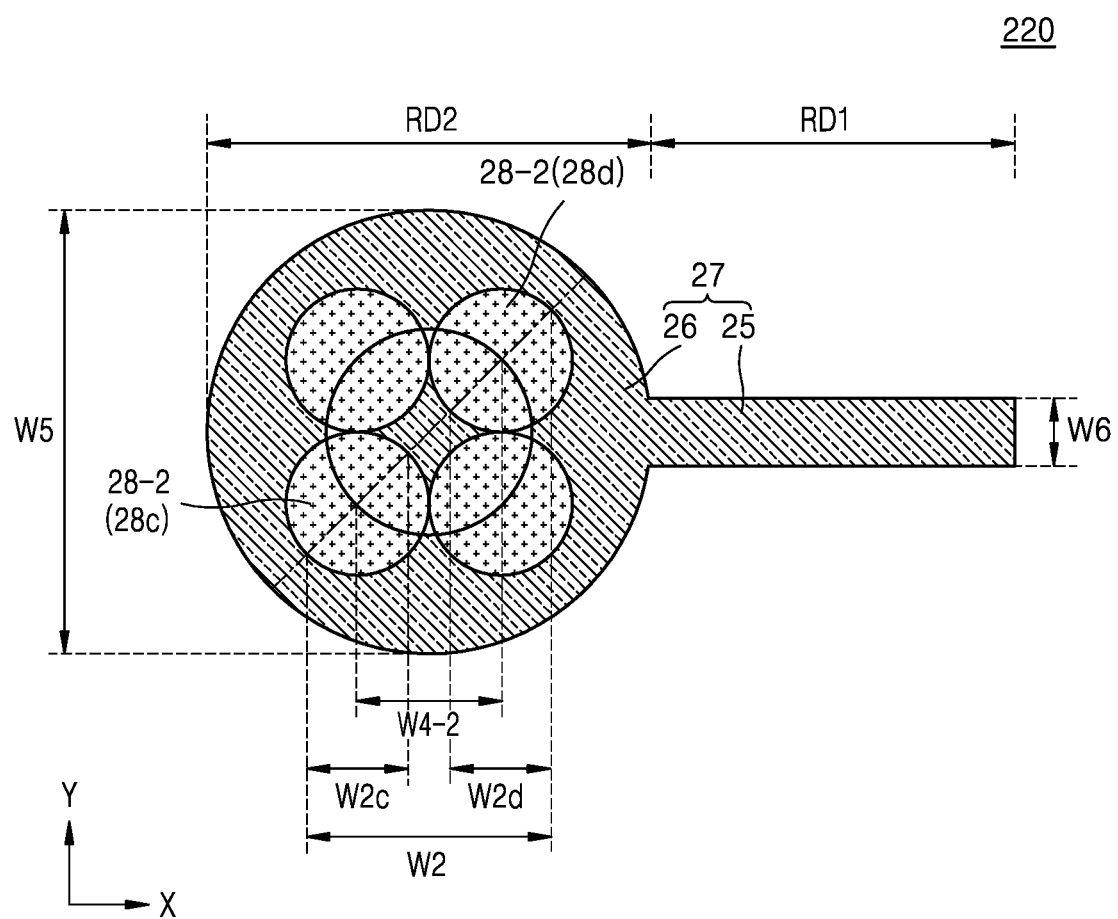
FIG. 16 is a plan layout diagram of a redistribution structure and a post layer of a semiconductor package in FIG. 15, according to an example embodiment.

FIG. 15 is a cross-sectional view of a semiconductor package according to an embodiment of the inventive concept, and FIG. 16 is a plan layout diagram of a redistribution structure and a post layer of the semiconductor package in FIG. 15.

A semiconductor package 220 of FIGS. 15 and 16 may be applied to the semiconductor package product 300 of FIG. 9. The semiconductor package 220 of FIGS. 15 and 16 may employ the semiconductor package 5 of FIGS. 5 and 6. The semiconductor package 220 in FIGS. 15 and 16 may be the same as the semiconductor package 5 of FIGS. 5 and 6 except that the detailed configuration of the semiconductor chip 20 and the redistribution structure 27 are further included as compared to the semiconductor package 5 of FIGS. 5 and 6.

In FIGS. 15 and 16, the same or similar reference numerals as in FIGS. 5, 6, and 9 through 12 may denote the same or similar members. In FIGS. 15 and 16, the same or similar descriptions given with reference to FIGS. 5, 6, and 9 through 12 are briefly given or omitted for convenience.

The semiconductor package 220 may, as illustrated in FIG. 15, include the chip level unit LE1-1, the medium level unit LE2-1, and the solder ball unit LE3-1 in a cross-sectional view. The chip level unit LE1-1 may include the semiconductor chip 20. The semiconductor chip 20 may include the passivation layer 14 and the chip pad 15 formed on the chip circuit layer 12 of the semiconductor substrate 10.

The medium level unit LE2-1 may include the redistribution structure 27, the post layer 28-2, the barrier layer 32-1, and the plurality of protection layers 34-1. The solder ball unit LE3-1 including the solder ball 36 may be on the medium level unit LE2-1. The medium level unit LE2-1 is described in detail.

The medium level unit LE2-1 may include the passivation layer 14 and the plurality of protection layers 34-1 formed on the chip pad 15. The first protection layer 22 may be formed on the passivation layer 14 and the chip pad 15. The redistribution structure 27 connected to the chip pad 15 may be formed on the first protection layer 22. The redistribution structure 27 may include the redistribution layer 25 extending from the chip pad 15 in a particular direction, for example, in the −X direction (e.g., the horizontal direction), and the wiring pad layer 26 at one end of the redistribution layer 25.

The redistribution structure 27 may be separated into the redistribution layer region RD1 in which the redistribution layer 25 is arranged and the redistribution pad region RD2 in which the redistribution pad layer 26 is formed, as illustrated in FIGS. 15 and 16.

The redistribution pad region RD2 may have the width (or diameter) W5 in the Y-axis direction and the width (or diameter) W1 in the X-axis direction. In other words, the redistribution pad layer 26 may have the width (or diameter) W1 in the X-axis direction. The width (or length) W6 of the redistribution layer region RD1 in the Y-axis direction may be less than the width (or diameter) W5 of the redistribution pad region RD2 in the Y-axis direction.

The medium level unit LE2-1 may include the second protection layer 24-1 including a plurality of wire-exposing holes H1c and H1d, which expose the wire pad layer 26 on the first protection layer 22. The wire-exposing holes H1c and H1d may be apart from each other.

The wire-exposing holes H1c and H1d may have the widths (or diameters) W2cH and W2dH, respectively. The widths (or diameters) W2cH and W2dH of the wire-exposing holes H1c and H1d may be different from the widths W2aH and W2cH of the wire-exposing holes H1a and H1b in FIG. 3, respectively. The widths (or diameters) W2cH and W2dH of the wire-exposing holes H1c and H1d may be greater than the widths W2aH and W2cH of the wire-exposing holes H1a and H1b in FIG. 3, respectively.

The medium level unit LE2-1 may include a post layer 28-2 formed in the wire-exposing holes H1c and H1d on the wiring pad layer 26. The post layer 28-2 may, as illustrated in FIG. 15, include sub-post layers 28c and 28d formed in the wire-exposing holes H1c and H1d, respectively.

The post layer 28-2 may include the plurality of sub-post layers 28c and 28d arranged in a circular shape (e.g., circular pattern) as illustrated in FIG. 16. Each of the sub-post layers 28c and 28d may have a single structure of a circular type in a plan view. Each of the sub-post layers 28c and 28d may be a circular pillar. The post layer 28-2 may be inside an outer diameter of the wiring pad layer 26 in a plan view.

The sub-post layer 28c may have the width (or diameter) W2c. The sub-post layer 28d may have the width (or diameter) W2d. The post layer 28-2 may have the outer width (diameter) W2. The outer width (or outer diameter) W2 of the post layer 28-2 may be less than the width (or diameter) W1 of the wiring pad layer 26.

The medium level unit LE2-1 may include the third protection layer 30 including the post-exposing hole H2-2 that exposes the post layer 28-2 in the second protection layer 24-1. The post-exposing hole H2-2 may also expose the second protection layer 24-1, and at the same time, may be tapered in a direction toward the post layer 28-2 and the second protection layer 24-1. The post-exposing hole H2-2 may have the width (or diameter) W4H-2.

The width (or diameter) W4H-2 of the post-exposing hole H2-2 may be less than the outer width (or diameter) W2 of the post layer 28-2. The lower width (or lower diameter) W4H-2 of the post-exposing hole H2-2 may be less than the upper width (or upper diameter) W4H'-2 thereof. The post layer 28-2 may include the plurality of sub-post layers 28c and 28d arranged in a circular shape along an edge of the post-exposing hole H2-2 as illustrated in FIG. 6.

The medium level unit LE2-1 may include a barrier layer 32-1 formed in the post-exposing hole H2-2 on the post layer 28-2. The barrier layer 32-1 may also contact the second protection layer 24-1, and may be recessed into the post layer 28-2 and the second protection layer 24-1. The barrier layer 32-1 may have the width (or diameter) W4-2 where it crosses an interface where the third protection layer 30 meets the second protection layer 24-1. The lower width (or lower diameter) W4-2 of the barrier layer 32-1 (e.g., where it crosses an interface where the third protection layer 30 meets the second protection layer 24-1) may be less than the upper width (or upper diameter) W3 thereof (e.g., where the barrier layer 32-1 crosses a surface of the third protection layer 30 that faces the solder ball 36).

As illustrated in FIG. 15, in the medium level unit LE2, the outer width (or outer diameter) W2 of the post layer 28-2 may be the same as the width (or diameter) W3 (e.g., an outermost width) of the barrier layer 32-1. In addition, the thickness T1 of the post layer 28-2 may be less than the thickness T2 of the solder ball 36.

As described above, the semiconductor package 220 according to an embodiment of the inventive concept configured as described above may increase the reliability thereof, by reducing stress applied to the vicinity of edges at both ends of the redistribution pad layers 26 constituting the semiconductor chip 20 as illustrated by the reference numeral 38 in FIG. 15 or applied to the redistribution layer 25, for example, mechanical impact stress or thermal impact stress, when or after the semiconductor chip 20 is physically or electrically connected to the circuit substrate 150 (refer to FIG. 9) by using the solder ball 36.

Figure 17:
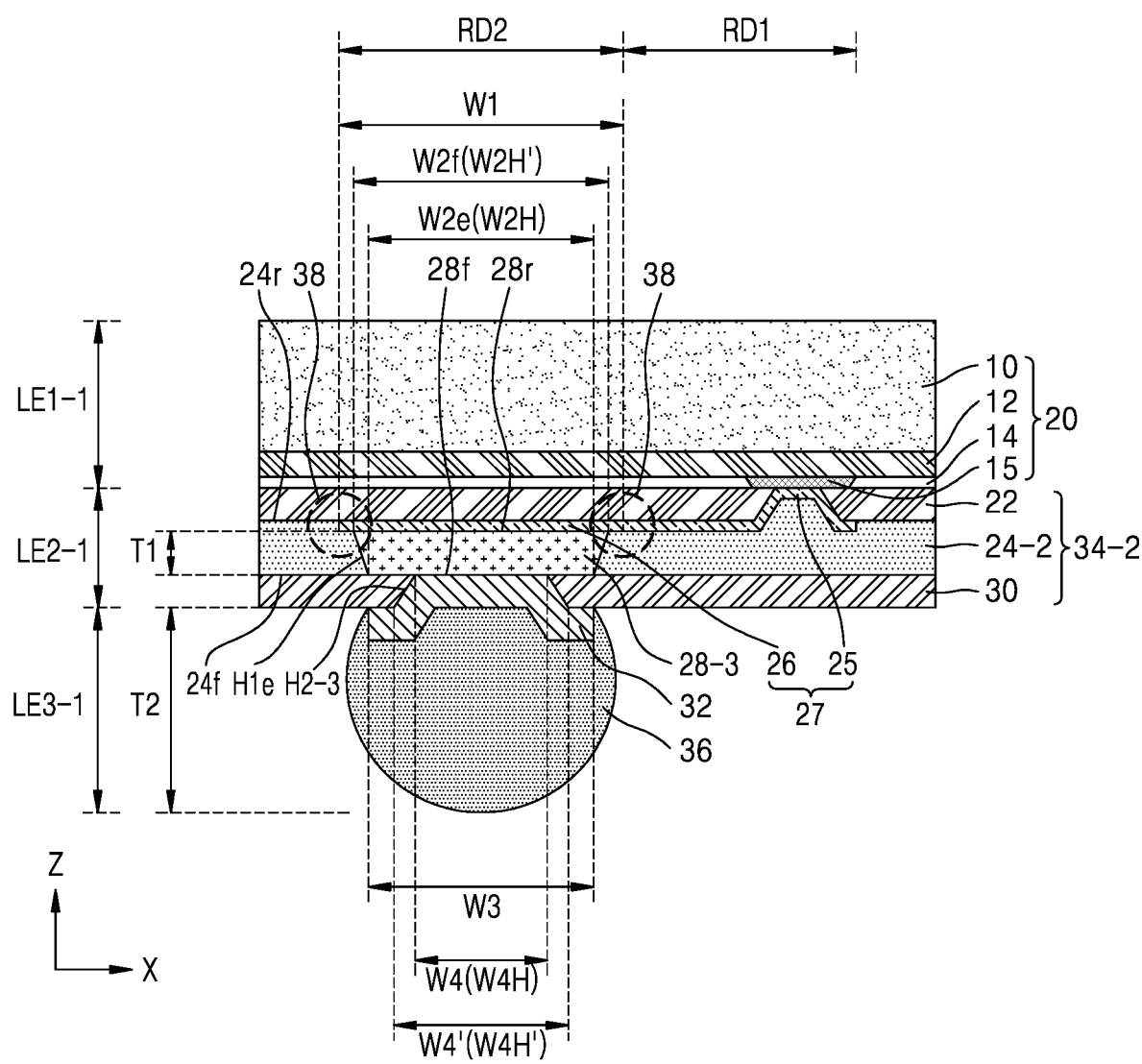
FIG. 17 is a cross-sectional view of a semiconductor package according to an embodiment of the inventive concept.
Figure 18:
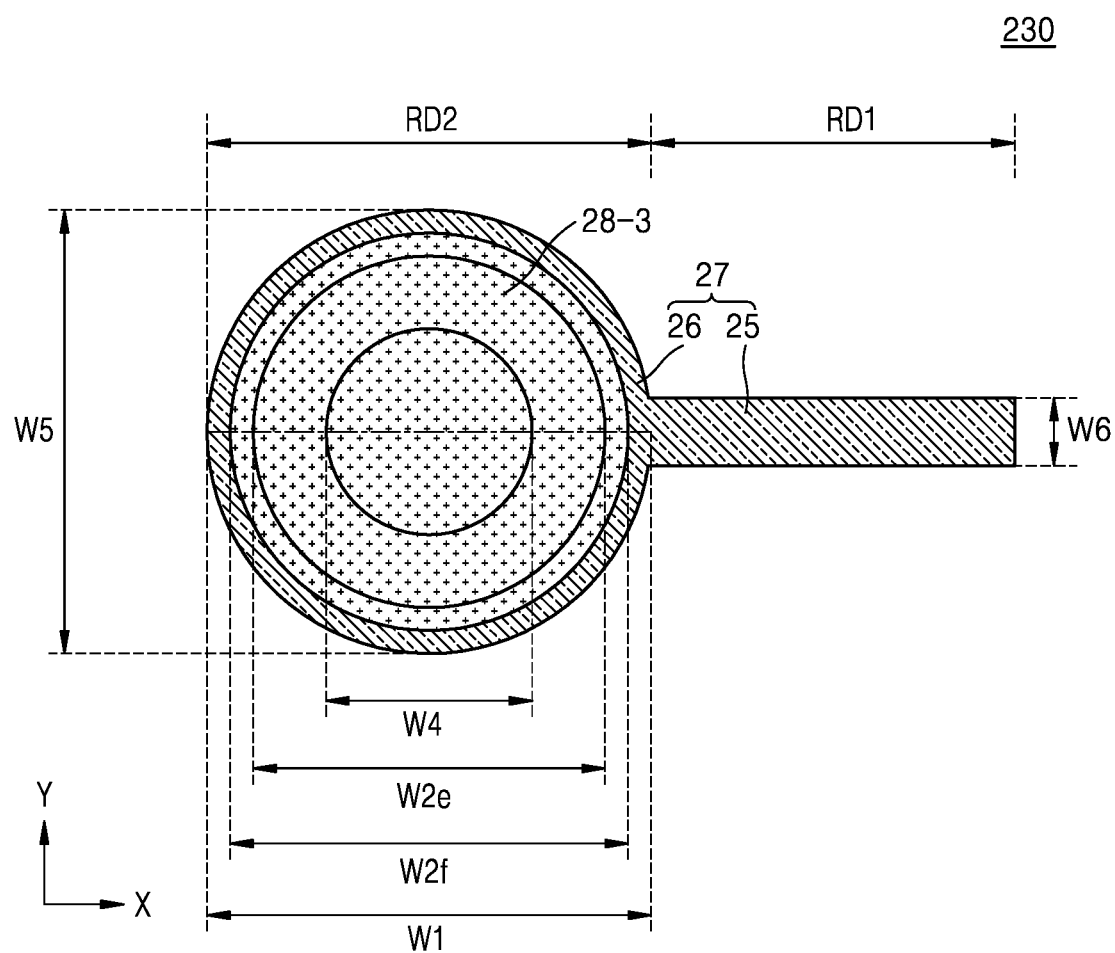
FIG. 18 is a plan layout diagram of a redistribution structure and a post layer of the semiconductor package in FIG. 17, according to an example embodiment.

FIG. 17 is a cross-sectional view of a semiconductor package according to an embodiment of the inventive concept, and FIG. 18 is a plan layout diagram of a redistribution structure and a post layer of the semiconductor package in FIG. 17.

A semiconductor package 230 of FIGS. 17 and 18 may be applied to the semiconductor package product 300 of FIG. 9. The semiconductor package 230 of FIGS. 17 and 18 may employ the semiconductor package 7 of FIGS. 7 and 8. The semiconductor package 230 in FIGS. 17 and 18 may be the same as the semiconductor package 7 of FIGS. 7 and 8 except that the detailed configuration of the semiconductor chip 20 and the redistribution structure 27 are further included as compared to the semiconductor package 7 of FIGS. 7 and 8.

In FIGS. 17 and 18, the same or similar reference numerals as in FIGS. 7, 8, and 9 through 12 may denote the same or similar members. In FIGS. 17 and 18, the same or similar descriptions given with respect to FIGS. 7, 8, and 9 through 12 are briefly given or omitted for convenience.

The semiconductor package 230 may, as illustrated in FIG. 17, include the chip level unit LE1-1, the medium level unit LE2-1, and the solder ball unit LE3-1 in a cross-sectional view. The chip level unit LE1-1 may include the semiconductor chip 20. The semiconductor chip 20 may include the passivation layer 14 and the chip pad 15 formed on the chip circuit layer 12 of the semiconductor substrate 10.

The medium level unit LE2-1 may include the redistribution structure 27, the post layer 28-3, the barrier layer 32, and the plurality of protection layers 34-2. The solder ball unit LE3-1 including the solder ball 36 may be on the medium level unit LE2-1. The medium level unit LE2-1 is described in detail.

The medium level unit LE2-1 may include the passivation layer 14 and the plurality of protection layers 34-2 formed on the chip pad 15. The first protection layer 22 may be formed on the passivation layer 14 and the chip pad 15. The redistribution structure 27 connected to the chip pad 15 may be formed on the first protection layer 22. The redistribution structure 27 may include the redistribution layer 25 extending from the chip pad 15 in an arbitrary direction, for example, in the −X direction (that is, the horizontal direction), and the redistribution pad layer 26 at one end of the redistribution layer 25.

The redistribution structure 27 may be separated into the redistribution layer region RD1 in which the redistribution layer 25 is arranged and the redistribution pad region RD2 in which the redistribution pad layer 26 is formed, as illustrated in FIGS. 17 and 18.

The redistribution pad region RD2 may have the width (or diameter) W5 in the Y-axis direction and the width (or diameter) W1 in the X-axis direction. In other words, the redistribution pad layer 26 may have the width (or diameter) W1 in the X-axis direction. The width (or length) W6 of the redistribution layer region RD1 in the Y-axis direction may be less than the width (or diameter) W5 of the redistribution pad region RD2 in the Y-axis direction.

The medium level unit LE2-1 may include a second protection layer 24-2 including the wire-exposing hole H1e exposing the redistribution pad layer 26 on the first protection layer 22. The wire-exposing hole H1e may have the width (or diameter) W2H'. A lower width (or diameter) W2H' of the wire-exposing hole H1e may be greater than the upper width (or diameter) W2H.

The medium level unit LE2-1 may include a post layer 28-3 formed in the wire-exposing hole H1e on the wire pad layer 26. The post layer 28-3 may be circular in a plan view as illustrated in FIG. 8. The post layer 28-3 may be inside the wiring pad layer 26 in a plan view as illustrated in FIG. 8. The post layer 28-3 may have a vertically circular pillar as illustrated in FIG. 8.

The post layer 28-3 may have the lower width (or diameter) W2f and the upper width (or diameter) W2e. The lower width (or diameter) W2f of the post layer 28-3 may be greater than the upper width (or diameter) W2e thereof. In other words, the post layer 28-3 may be a single structure having the upper and lower widths (or diameters) W2e and W2f that are different from each other.

The widths (or diameters) W2e and W2f of the post layer 28-3 may be less than the width (or diameter) W1 of the wiring pad layer 26. An upper surface 28f of the post layer 28-3 may be a flat surface. The upper surface 28f of the post layer 28-3 may be coplanar with the upper surface of the second protection layer 24-2.

The medium level unit LE2-1 may include the third protection layer 30 including the post-exposing hole H2-3 exposing the post layer 28 in the second protection layer 24-2. The post-exposing hole H2-3 may have the width (or diameter) W4H.

The width (or diameter) W4H of the post-exposing hole H2-3 may be less than the widths (or diameters) W2H and W2H' of the wire-exposing hole H1e. The lower width (or lower diameter) W4H of the post-exposing hole H2 may be less than the upper width (or upper diameter) W4H' thereof.

The medium level unit LE2-1 may include the barrier layer 32 formed in the post-exposing hole H2 on the post layer 28. The barrier layer 32 may have the width (or diameter) W3, for example where it crosses an interface where the third protection layer 30 meets the second protection layer 24-2. The lower width (or lower diameter) W4 of the barrier layer 32, for example, where it crosses an interface of the third protection layer 30 that faces the solder ball 36, may be less than the upper width (or upper diameter) W3 thereof.

As illustrated in FIG. 17, in the medium level unit LE2-1, the widths (or diameters) W2e and W2f of the post layer 28-3 may be less than the width (or diameter) W3 of the barrier layer 32. In addition, the thickness T1 of the post layer 28-3 may be less than the thickness T2 of the solder ball 36 (e.g., a maximum thickness in the Z direction).

As described above, the semiconductor package 230 according to an embodiment of the inventive concept configured as described above may increase the reliability thereof, by reducing stress applied to the vicinity of edges at both ends of the redistribution pad layers 26 constituting the semiconductor chip 20 as illustrated by the reference numeral 38 in FIG. 17 or applied to the redistribution layer 25, for example, mechanical impact stress or thermal impact stress, when or after the semiconductor chip 20 is physically or electrically connected to the circuit substrate 150 (refer to FIG. 9) by using the solder ball 36.

Figure 19:
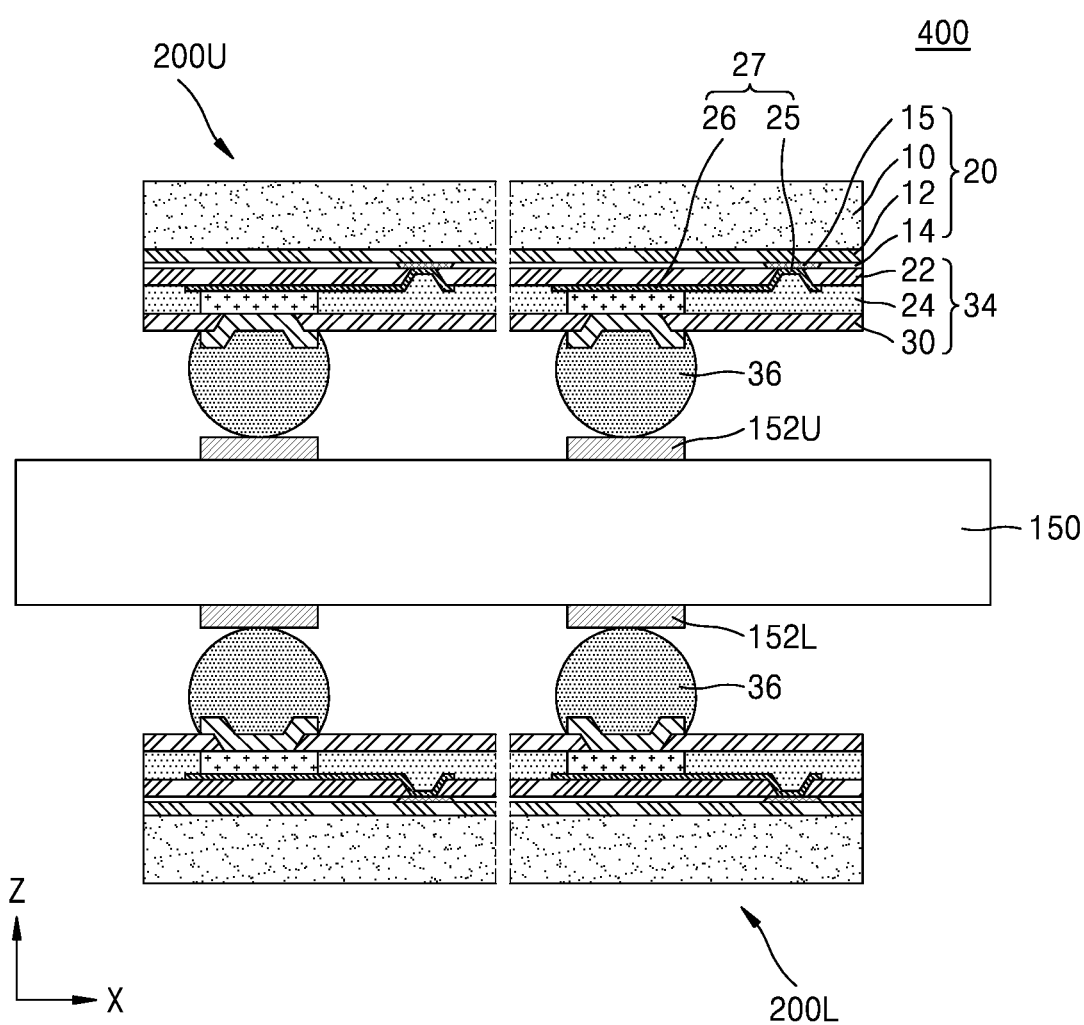
FIG. 19 is a cross-sectional view of a semiconductor package product including a semiconductor package, according to an embodiment of the inventive concept.

FIG. 19 is a cross-sectional view of a semiconductor package product including a semiconductor package, according to an embodiment of the inventive concept. The semiconductor package product 300 may be, for example, a semiconductor package, or may be a memory module. For example, semiconductor package product 300 may be a memory module, such as a single in-line memory module (SIMM) or may be part of a dual in-line memory module (DIMM).

A semiconductor package product 400 may be the same as the semiconductor package product 300 of FIG. 9 except that upper and lower semiconductor packages 200U and 200L are arranged on both sides of the circuit substrate, respectively. Each of the upper and lower semiconductor packages 200U and 200L may correspond to the semiconductor package 200 of FIG. 9.

Each of the upper and lower semiconductor packages 200U and 200L may, as the semiconductor package 200, employ the semiconductor package 1 of FIG. 1. In FIG. 19, the same or similar reference numerals as in FIG. 9 may denote the same or similar members.

The semiconductor package product 400 may include the circuit substrate 150 and the upper and lower semiconductor packages 200U and 200L. The circuit substrate 150 may include a printed circuit board. An upper connection pad 152U and a lower surface connection pad 152L may be on upper and lower surfaces of the circuit substrate 150, respectively.

The solder ball 36 of the upper semiconductor package 200U may be connected to the upper connection pad 152U. The solder ball 36 of the lower semiconductor package 200L may be connected to the lower connection pad 152L. The solder balls 36 of the upper and lower semiconductor packages 200U and 200L may be mechanically and electrically connected to each other via the circuit substrate 150 and the upper and lower connection pads 152U and 152L. The semiconductor package product 400 as described above may include the upper and lower semiconductor packages 200U and 200L on the upper and lower surfaces of the circuit substrate 150, respectively, and may increase capacity, for example, memory capacity.

Figure 20:
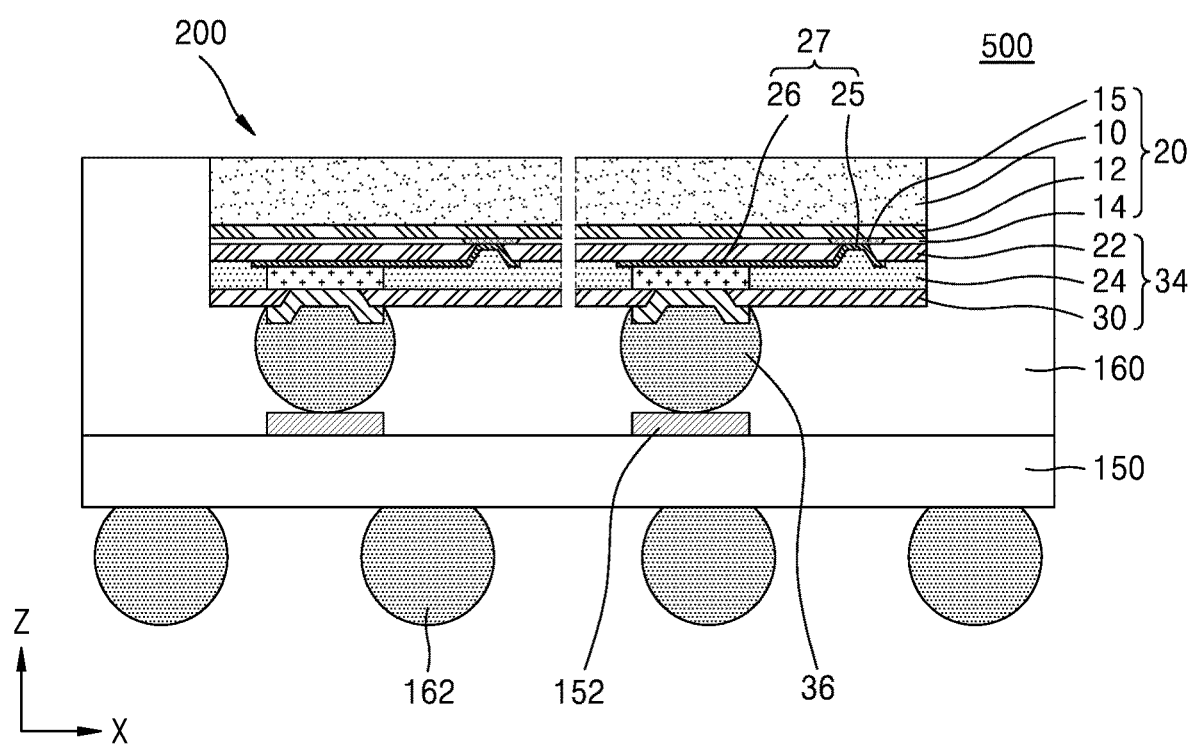
FIG. 20 is a cross-sectional view of a semiconductor package product according to an embodiment of the inventive concept.

FIG. 20 is a cross-sectional view of a semiconductor package product according to an embodiment of the inventive concept.

The semiconductor package product 500 may be the same as semiconductor package product 300 of FIG. 9 except that the molding layer 160 is formed on the circuit substrate 150 when compared to the semiconductor package product 300 of FIG. 9. The semiconductor package 200 may correspond to the semiconductor package 200 of FIG. 9. The semiconductor package 200 illustrated in FIG. 20 may include a fan-in wafer level package.

The semiconductor package 200 may employ the semiconductor package 1 of FIG. 1. The semiconductor package product 500 may be, for example, a semiconductor package, and in one embodiment, is a package-on-package device. In FIG. 20, the same or similar reference numerals as in FIG. 9 may denote the same or similar members.

The semiconductor package product 500 may include the circuit substrate 150 and the semiconductor package 200 that is molded. The connection pad 152 may be on the circuit substrate 150. A connection terminal 162 may be under the circuit substrate 150. The solder ball 36 of the semiconductor package 200 may be mechanically and electrically connected to the connection pad 152. The semiconductor package 200 on the circuit substrate 150 may be molded by the molding layer 160. The molding layer 160 may include a resin layer, for example, an epoxy resin. The semiconductor package product 500 as described above may increase the reliability thereof by molding the semiconductor package 200 with the molding layer 160.

Figure 21:
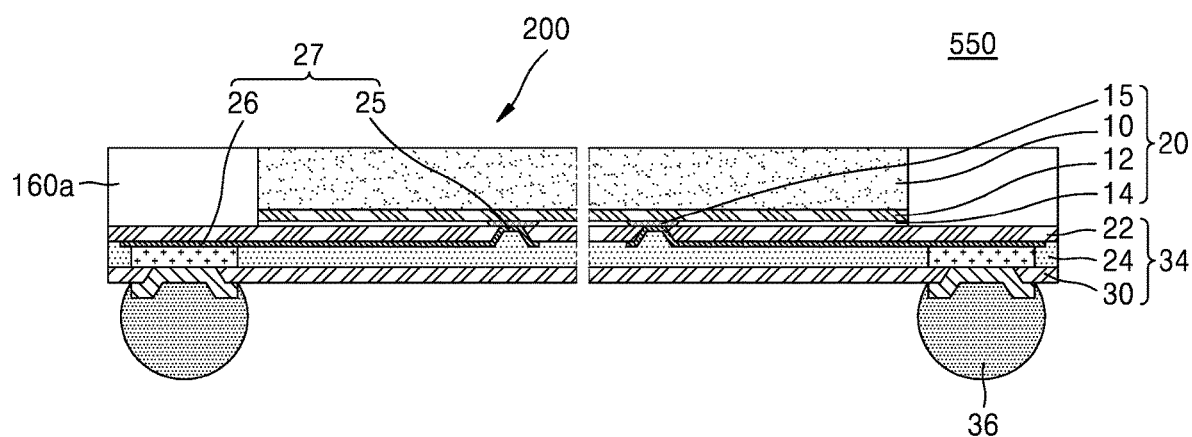
FIG. 21 is a cross-sectional view of a semiconductor package product according to an embodiment of the inventive concept.

FIG. 21 is a cross-sectional view of a semiconductor package according to an embodiment of the inventive concept.

A semiconductor package 550 may be the same as semiconductor package 200 of FIG. 9 except that a molding layer 160a is included and the solder ball 36 is formed under the molding layer 160a when compared to the semiconductor package 200 of FIG. 9. The semiconductor package 550 may employ the semiconductor package 200 of FIG. 9. The semiconductor package 200 may employ the semiconductor package 1 of FIG. 1. The semiconductor package 200 illustrated in FIG. 21 may include a fan-in wafer level package. In FIG. 21, the same or similar reference numerals as in FIG. 9 may denote the same or similar members.

The semiconductor package 550 may include the molding layer 160a on opposite, outer sides of the semiconductor chip 20. The semiconductor package 550 may further extend the redistribution structure 27 including the redistribution layer 25 and the redistribution pad layer 26 under the molding layer 160a.

In other words, the semiconductor package 550 may further extend the redistribution pad layer 26 to under the molding layer 160a. The molding layer 160a may include a resin layer, for example, an epoxy resin. The solder ball 36 may be under the molding layer 160a. The solder balls 36 of the semiconductor package 550 may be additionally connected to the circuit substrate 150. The semiconductor package 550 as described above may increase design freedom by extending the redistribution layer 25 under the molding layer 160a.

Figure 22:
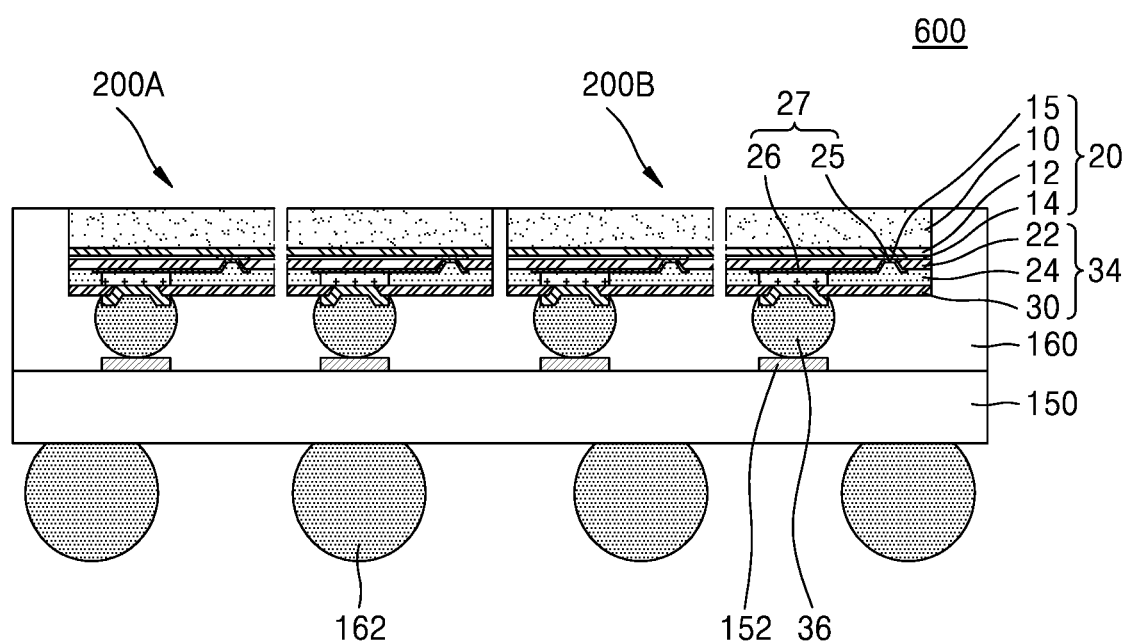
FIG. 22 is a cross-sectional view of a semiconductor package product according to an embodiment of the inventive concept.

FIG. 22 is a cross-sectional view of a semiconductor package product according to an embodiment of the inventive concept.

A semiconductor package 600 may be the same as semiconductor package 500 of FIG. 20 except that semiconductor packages 200A and 200B are included above the circuit substrate 150 when compared to the semiconductor package 500 of FIG. 20. Note that the dotted lines in FIGS. 19-22 depicted a break in the drawing and do not indicate separate devices. However, FIG. 22 shows an example of two separated semiconductor packages 200A and 200B.

Each of the semiconductor packages 200A and 200B may correspond to the semiconductor package 200 of FIG. 9. Each of the semiconductor packages 200A and 200B (two are shown, though more than two may be included in semiconductor package 600) may employ the semiconductor package 1 of FIG. 1 or other figures discussed above. In FIG. 22, the same or similar reference numerals as in FIG. 9 may denote the same or similar members.

The semiconductor package 600 may include semiconductor packages 200A and 200B molded on the circuit substrate 150. The connection pad 152 may be on the circuit substrate 150. A connection terminal 162 may be under the circuit substrate 150. The solder ball 36 of the semiconductor packages 200A and 200B may be mechanically and electrically connected to the connection pad 152.

The semiconductor packages 200A and 200B on the circuit substrate 150 may be molded by the molding layer 160. The molding layer 160 may include a resin layer, for example, an epoxy resin. The semiconductor package 600 as described above may increase capacity by mounting two different kinds of semiconductor packages 200A and 200B on the circuit substrate 150.

Figure 23:
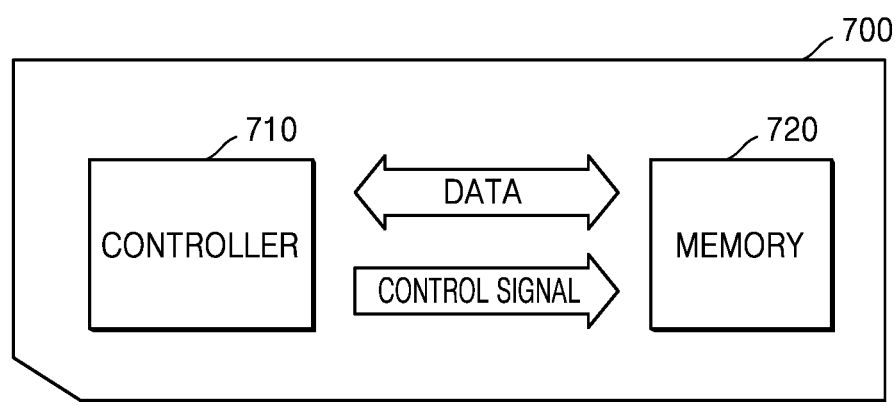
FIG. 23 is a schematic diagram of a configuration of a card using a semiconductor package, according to the inventive concept.

FIG. 23 is a schematic diagram of a configuration of a card using a semiconductor package, according to aspects of the inventive concept.

A semiconductor package or in some cases a semiconductor package product as described above may be applied to a card 700. The card 700 may include a multimedia card (MMC), a secure digital (SD) card, or the like. The card 700 may include a controller 710 and a memory 720.

The memory 720 may include a flash memory, a phase change random access memory (PRAM), or other type of non-volatile memory. The controller 710 may transmit a control signal to the memory 720, and data may be exchanged between the controller 710 and the memory 720.

Either one or both of the controller 710 and the memory 720 constituting the card 7000 may employ a semiconductor package or a semiconductor package product of inventive concept as described above. In this case, the reliability of the card 700 may be improved.

Figure 24:
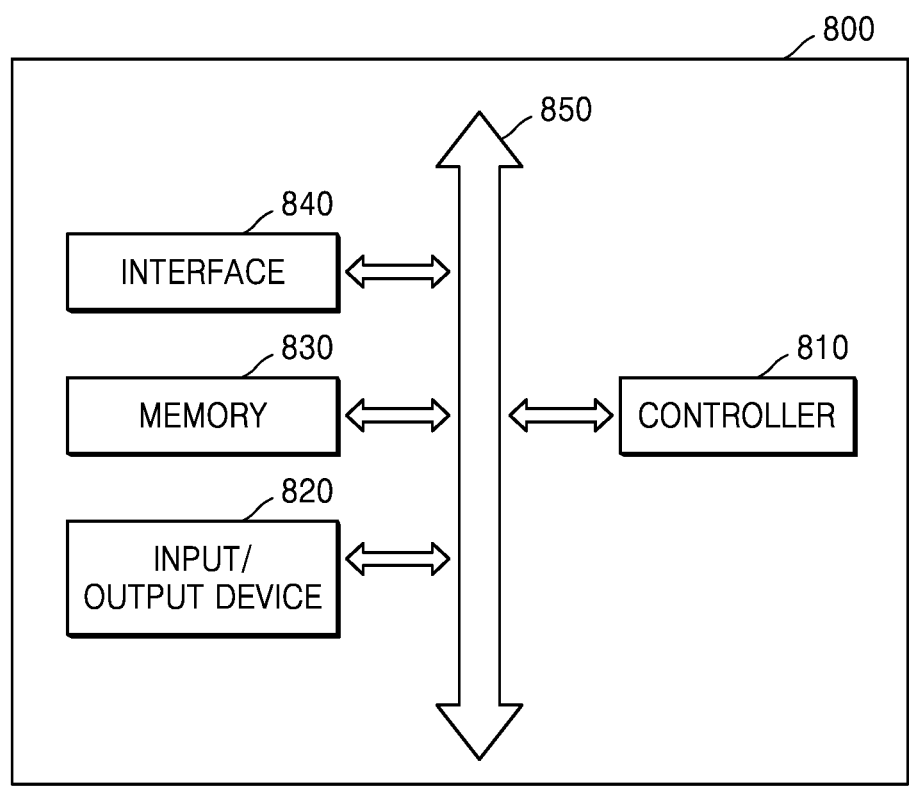
FIG. 24 is a schematic diagram of a configuration of an electronic system using a semiconductor package, according to the inventive concept.

FIG. 24 is a schematic diagram of a configuration of an electronic system using a semiconductor package, according to aspects of the inventive concept.

An electronic system 800 according to aspects of the inventive concept may be a computer, a mobile phone, an MPEG Audio Layer-3 (MP3) player, a navigator, or the like.

The electronic system 800 may include a controller 810, an input/output device 820, a memory 830, and an interface 840. Control signals or data may be exchanged between the controller 810 and the input/output device 820, the memory 830, and the interface 840 by using a communication channel 850.

A semiconductor package or a semiconductor package product described above may be employed in the controller 810 and the memory 830 in the electronic system 800 according to aspects of the inventive concept. In this case, the electronic system 800 according to aspects of the inventive concept may implement various functions and improve the reliability thereof.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a chip level portion comprising a semiconductor chip;
   a medium level portion on the chip level portion; and
   a solder ball portion on the medium level portion, wherein the solder ball portion is configured to be connected to a circuit substrate,
   wherein the medium level portion comprises:
   a wiring pad layer on a first protection layer, the first protection layer being a layer of a plurality of protection layers and being directly adjacent to the chip level portion;
   a second protection layer comprising a pad-exposing hole exposing the wiring pad layer on the first protection layer, the second protection layer being an intermediate portion of the plurality of protection layers;
   a post layer in the pad-exposing hole on the wiring pad layer;
   a third protection layer on the second protection layer and comprising a post-exposing hole on the second protection layer and exposing the post layer, the third protection layer corresponding to an outer protection layer of the plurality of protection layers, wherein a width or diameter of the post-exposing hole is less than a width or diameter of the pad-exposing hole; and
   a barrier layer in the post-exposing hole on the post layer, wherein the solder ball portion comprises a solder ball on the barrier layer.

2. The semiconductor package of claim 1, wherein a width or diameter of the post layer is less than or equal to a width diameter of the barrier layer.

3. The semiconductor package of claim 1, wherein a first width or first diameter of the post-exposing hole at the post layer is less than a second width or second diameter of the post-exposing hole adjacent to the solder ball, and a first width or first diameter of the barrier layer at a first surface of the barrier layer is less than a second width or second diameter of the barrier layer at a second surface of the barrier layer opposite the first surface.

4. The semiconductor package of claim 1, wherein a modulus of elasticity of the second protection layer is greater than a modulus of elasticity of the third protection layer.

5. The semiconductor package of claim 1, wherein the post layer has a single continuous structure of a circular or ring shape in a plan view.

6. The semiconductor package of claim 1, wherein the post layer has a single continuous structure in which a width of a first surface of the post layer is the same as a width of a second surface of the post layer opposite the first surface.

7. The semiconductor package of claim 1, wherein the post layer has a single continuous structure in which a width of a first surface of the post layer is greater than a width of a second surface of the post layer opposite the first surface.

8. The semiconductor package of claim 1, wherein the post layer comprises a plurality of sub-post layers having circular shapes and arranged along an edge of the post-exposing hole in a plan view.

9. The semiconductor package of claim 1, wherein a surface of the post layer that contacts the barrier layer is coplanar with a surface of the second protection layer.

10. A semiconductor package comprising:
    a semiconductor chip;
    a first protection layer on the semiconductor chip;
    a redistribution pad layer on the first protection layer;
    a second protection layer comprising a pad-exposing hole exposing the redistribution pad layer on the redistribution pad layer;
    a post layer in the pad-exposing hole on the redistribution pad layer;
    a third protection layer comprising a post-exposing hole on the post layer and exposing the post layer, wherein the post-exposing hole is smaller than the pad-exposing hole;
    a barrier layer in the pad-exposing hole on the post layer; and
    a solder layer on the barrier layer,
    wherein a modulus of elasticity of the second protection layer is greater than a modulus of elasticity of the third protection layer.

11. The semiconductor package of claim 10, wherein the barrier layer extends outward from the post-exposing hole on the third protection layer, and a maximum width or diameter of the post layer is equal to or less than a minimum width or diameter of the barrier layer on the third protection layer.

12. The semiconductor package of claim 10, wherein the second protection layer comprises a material having a modulus of elasticity that is greater than or equal to a modulus of elasticity of the first protection layer.

13. The semiconductor package of claim 10, wherein the post layer has a circular shape in a plan view, and the post layer has a single pillar in which widths (or diameters) of upper and lower portions are identical to each other.

14. The semiconductor package of claim 10, wherein the post layer comprises a plurality of sub-post layers arranged in a circular shape along an edge of the post-exposing hole in a plan view.

15. The semiconductor package of claim 10, wherein the post layer has a circular shape in a plan view, and an upper surface of the post layer is a curved surface.

16. A semiconductor package comprising:
    a semiconductor chip comprising a chip circuit layer on a semiconductor substrate, and a chip pad connected to the chip circuit layer;
    a first protection layer on the chip circuit layer and the chip pad;
    a redistribution structure comprising a redistribution layer including a first portion penetrating the first protection layer and connected to the chip pad, the first portion extending from the chip pad on the first protection layer in a horizontal direction, and a second portion at one end portion of the redistribution layer;

a second protection layer comprising a pad-exposing hole on the redistribution structure and exposing the second portion of the redistribution layer;

a post layer in the pad-exposing hole on the redistribution structure;

a third protection layer comprising a post-exposing hole on the post layer and exposing the post layer, wherein the post-exposing hole is smaller than the pad-exposing hole;

a barrier layer in the post-exposing hole on the post layer; and a solder layer on the barrier layer, wherein a maximum width or diameter of the post layer is equal to or less than a minimum width or diameter of the barrier layer, and a modulus of elasticity of the second protection layer is greater than a modulus of elasticity of the third protection layer.

17. The semiconductor package of claim 16, wherein a first surface of the post layer in contact with the barrier layer is a flat surface, and a thickness of the post layer is less than a maximum thickness of the solder layer.

18. The semiconductor package of claim 17, wherein the post layer has a circular shape in a plan view, and the post layer has a single pillar in which a width or diameter of a lower portion corresponding to a second surface opposite the first surface is greater than a width or diameter of an upper portion corresponding to the first surface.

19. The semiconductor package of claim 16, wherein the post layer has a single continuous structure of a circular shape or ring shape in a plan view.

20. The semiconductor package of claim 16, wherein the post layer comprises a plurality of sub-post layers arranged in a circular shape along an edge of the post-exposing hole.

* * * * *